US010566813B2

(12) United States Patent
Jo et al.

(10) Patent No.: US 10,566,813 B2
(45) Date of Patent: Feb. 18, 2020

(54) METHOD FOR CONTROLLING OPERATION OF BATTERY ON BASIS OF STATE THEREOF, AND ELECTRONIC DEVICE FOR SUPPORTING SAME

(71) Applicant: Samsung Electronics Co., Ltd., Gyeonggi-do (KR)

(72) Inventors: Nam-Min Jo, Seoul (KR); Kyungmin Ryu, Gyeonggi-do (KR); Sean Kwon, Gyeonggi-do (KR); Taewoo Kim, Gyeonggi-do (KR); Kyungdon Nam, Gyeonggi-do (KR); Jinyeol Park, Gyeonggi-do (KR); Chang-Hee Yoo, Gyeonggi-do (KR); Gyudae Jang, Gwangju (KR); Jung-Bae Jeon, Gyeonggi-do (KR); Myoung-Dae Jin, Gyeonggi-do (KR); Hyung-Geun Choi, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 85 days.

(21) Appl. No.: 15/983,302

(22) Filed: May 18, 2018

(65) Prior Publication Data
US 2018/0342886 A1    Nov. 29, 2018

(30) Foreign Application Priority Data
May 24, 2017   (KR) .................. 10-2017-0063859

(51) Int. Cl.
*H02J 7/00*    (2006.01)
*G01R 31/392*  (2019.01)
*G01R 31/36*   (2020.01)

(52) U.S. Cl.
CPC .......... *H02J 7/0063* (2013.01); *G01R 31/392* (2019.01); *G01R 31/3646* (2019.01); *H02J 2007/0067* (2013.01)

(58) Field of Classification Search
USPC .................................................. 320/106, 112
See application file for complete search history.

(56) References Cited

U.S. PATENT DOCUMENTS

2018/0342886 A1*  11/2018  Jo ..................... H02J 7/0063

FOREIGN PATENT DOCUMENTS

KR       1998-032697 U       9/1998

* cited by examiner

*Primary Examiner* — Robert Grant
(74) *Attorney, Agent, or Firm* — Cha & Reiter, LLC

(57) ABSTRACT

Disclosed are a method for controlling an operation of a battery on the basis of the state thereof, and an electronic device for supporting the same. The electronic device includes: a battery connector including multiple terminals; a battery detection circuit configured to detect whether a battery is connected to the battery connector; a short-circuit detection circuit configured to detect whether a battery identification (ID) terminal among the multiple terminals is short to a ground, based at least partly on a level of a voltage measured at the battery ID terminal and a predetermined voltage level; and a processor, wherein the processor may be configured to: acquire, from the battery detection circuit, a first signal related to whether the battery is connected to the battery connector; determine whether the battery is connected to the battery connector, based at least partly on the first signal; acquire, from the short-circuit detection circuit, a second signal related to whether the battery ID terminal is short-circuited to the ground; based at least in part on the first and second signals, determining whether: the battery is not connected; the battery is properly connected; or the battery is improperly connected; and control an operation of (Continued)

the battery based at least partly on determining whether the battery is not connected, the battery is properly connected, or the battery is improperly connected.

20 Claims, 11 Drawing Sheets

METHOD FOR CONTROLLING OPERATION OF BATTERY ON BASIS OF STATE THEREOF, AND ELECTRONIC DEVICE FOR SUPPORTING SAME

CROSS-REFERENCE TO RELATED APPLICATION(S)

This application is based on and claims priority under 35 U.S.C. § 119 to Korean Patent Application No. 10-2017-0063859, filed on May 24, 2017, in the Korean Intellectual Property Office, the disclosure of which is incorporated by reference herein in its entirety.

BACKGROUND

1) Field

The present disclosure relates to a method for controlling an operation of a battery on the basis of the state thereof, and an electronic device for supporting the same.

2) Description of Related Art

The above information is presented as background information only to assist with an understanding of the present disclosure. No determination has been made, and no assertion is made, as to whether any of the above might be applicable as prior art with regard to the present disclosure.

With the advancement of information communication technology, semiconductor technology, and the like, the spread and use of various electronic devices have rapidly increased. According to the wide proliferation of electronic devices, an electronic device has supported various functions in association with other electronic devices.

In order to support various functions, an electronic device requires a lot of power, and to this end, research on technology related to a battery, which supplies power to each element thereof, and technology for controlling charging of the battery has been actively conducted.

SUMMARY

In conventional technology, when an electronic device is supplied with power through a charging apparatus and a battery terminal is not properly connected to (or does not come in proper contact with) a terminal of a battery connector an over-current or over-discharge, may occur.

An aspect of the present disclosure may provide a method for controlling an operation of a battery and an electronic device for supporting the same, wherein the method and the electronic device control an operation of charging the battery, based at least partly on whether an identification (ID) terminal of a battery connector is short-circuited to the ground.

The technical problems that may be solved by the present disclosure are not limited to the above-mentioned technical problems, and other technical problems will be clearly understood, in the following description, by those having ordinary knowledge in the technical field to which the present disclosure pertains.

In accordance with an aspect of the present disclosure, an electronic device may include: a battery connector including multiple terminals; a battery detection circuit configured to detect whether a battery is connected to the battery connector; a short-circuit detection circuit configured to detect whether a battery identification (ID) terminal among the multiple terminals is short to a ground, based at least partly on a level of a voltage measured at the battery ID terminal and a predetermined voltage level; and a processor, wherein the processor may be configured to: acquire, from the battery detection circuit, a first signal related to whether the battery is connected to the battery connector; determine whether the battery is connected to the battery connector, based at least in part on the first and second signals, determining whether: the battery is not connected; the battery is properly connected; or the battery is improperly connected; and control an operation of the battery, based at least partly on determining whether the battery is not connected, the battery is properly connected, or the battery is improperly connected.

In accordance with another aspect of the present disclosure, a method for controlling an operation of a battery by an electronic device may include: acquiring a first signal related to whether the battery is connected to the battery connector, from a battery detection circuit configured to detect whether the battery is connected to the battery connector including multiple terminals; determining whether the battery is connected to the battery connector, based at least partly on the first signal; acquiring a second signal related to whether the battery ID terminal is short-circuited to the ground, from a short-circuit detection circuit configured to detect whether a battery identification (ID) terminal among the multiple terminals is short-circuited to a ground, based at least partly on a level of a voltage measured at the battery ID terminal and a predetermined voltage level; determining whether the battery ID terminal is short to the ground, based at least in part on the first and second signals, determining whether: the battery is not connected; the battery is properly connected; or the battery is improperly connected; and controlling an operation of the battery based at least partly on determining whether the battery is not connected, the battery is properly connected, or the battery is improperly connected.

In accordance with still another aspect of the present disclosure, an electronic device may include: a battery connector including multiple terminals; a battery detection circuit configured to detect whether a battery is connected to the battery connector; a short-circuit detection circuit configured to detect whether a battery Identification (ID) terminal among the multiple terminals is short to a ground, based at least partly on a level of a voltage measured at the battery ID terminal and a predetermined voltage level; and a processor, wherein the processor may be configured to: acquire, from the battery detection circuit, a first signal related to whether the battery is connected to the battery connector; acquire, from the short-circuit detection circuit, a second signal related to whether the battery ID terminal is short to the ground; determine based at least in part on the first and second signals, whether the battery is not connected; the battery is properly connected; or the battery is improperly connected; and control an operation of the battery based at least partly on the determination.

The method for controlling an operation of a battery on the basis of the state thereof and the electronic device for supporting the same according to various embodiments can detect that a battery is improperly connected, and when the battery is improperly connected, can limit an operation of charging a battery by using power supplied from a charging apparatus.

Also, the method for controlling an operation of a battery and the electronic device for supporting the same according to various embodiments can meet international standards (e.g., the Cellular Telecommunications and Internet Association (CTIA) Test (or Certification) standards).

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
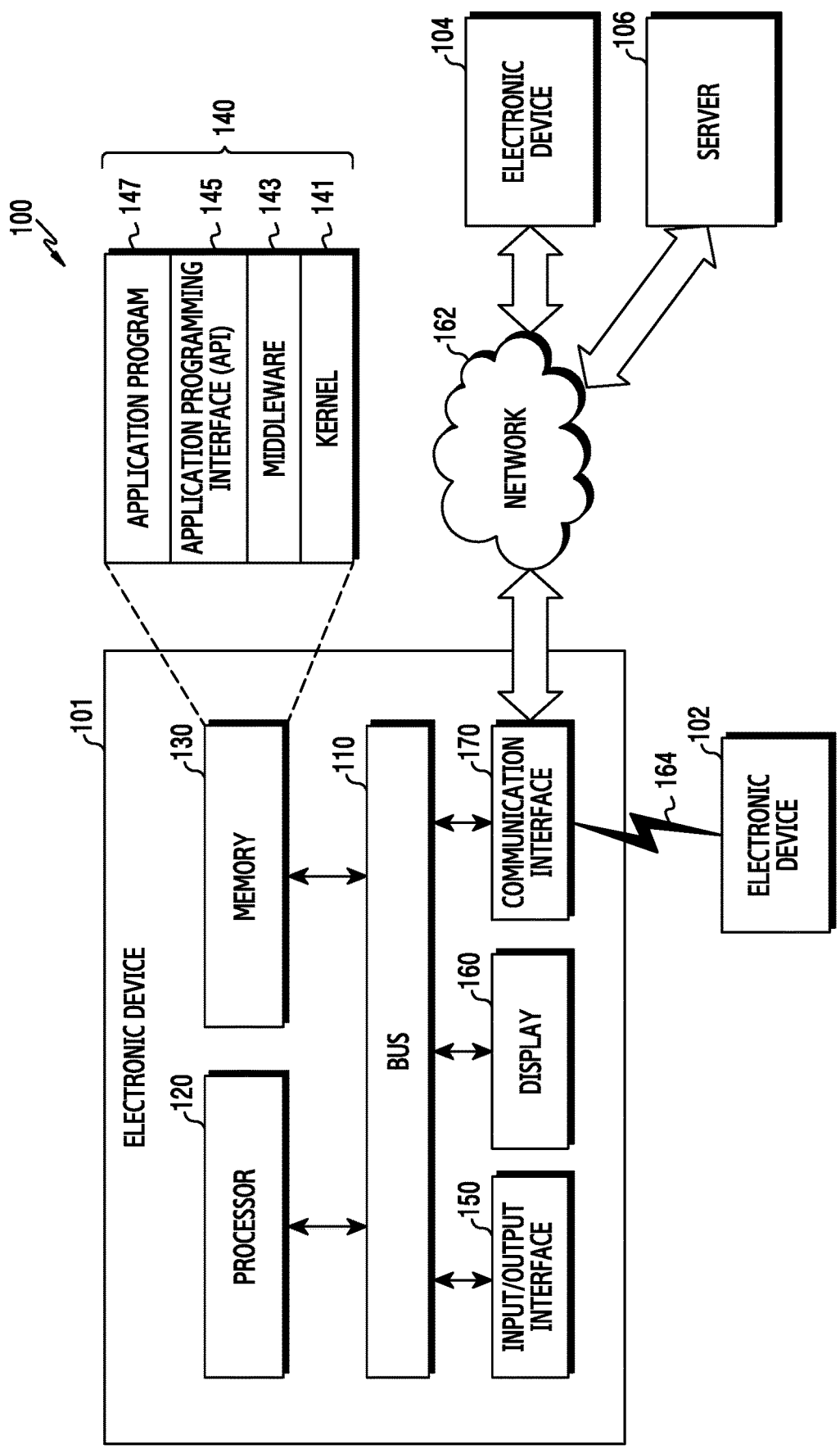
FIG. 1 is a view illustrating an environment of a network including an electronic device according to various embodiments.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including both at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and Play Station™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

Figure 2:
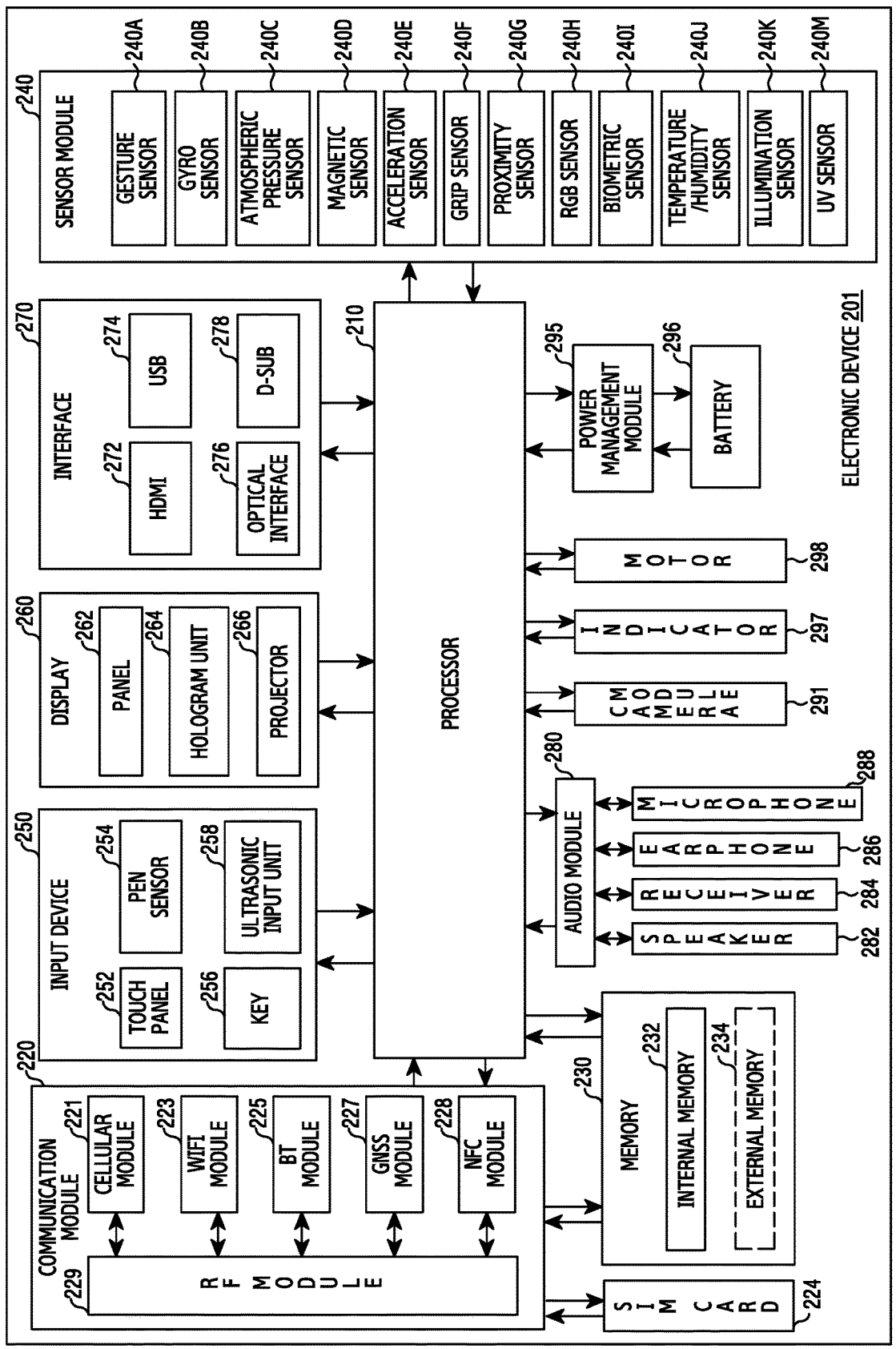
FIG. 2 is a block diagram illustrating a configuration of an electronic device according to various embodiments.

When an electronic device is supplied with power through a charging apparatus and a battery terminal is not properly connected to (or does not come in proper contact with) a terminal of a battery connector an over-current or over-discharge, may occur. FIGS. 1 and 2 describe an electronic device where the foregoing problem can occur.

FIG. 1 illustrates a network environment including an electronic device according to various embodiments of the present disclosure.

An electronic device 101 within a network environment 100, according to various embodiments, will be described with reference to FIG. 1. The electronic device 101 may include a bus 110, a processor 120, a memory 130, an input/output interface 150, a display 160, and a communication interface 170. In some embodiments, the electronic device 101 may omit at least one of the above elements or may further include other elements.

The bus 110 may include, for example, a circuit for connecting the elements 110-170 and transferring communication (e.g., control messages and/or data) between the elements.

The processor 120 may include one or more of a Central Processing Unit (CPU), an Application Processor (AP), and a Communication Processor (CP). The processor 120, for example, may carry out operations or data processing relating to control and/or communication of at least one other element of the electronic device 101.

The memory 130 may include a volatile memory and/or a non-volatile memory. The memory 130 may store, for example, instructions or data relevant to at least one other element of the electronic device 101. According to an embodiment, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data.

In addition, the middleware 143 may process one or more operation requests received from the application program 147 according to priority. For example, the middleware 143 may give priority to use the system resources of the electronic device 101 (for example, the bus 110, the processor 120, the memory 130, and the like) to at least one of the application programs 147. For example, the middleware 143 may perform scheduling or load balancing with respect to the one or more operation requests by processing the one or more operation requests according to the priority given to the at least one application program.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160, for example, may display various types of content (e.g., text, images, videos, icons, or symbols) for the user. The display 160 may include a touch screen and receive, for example, a touch, gesture, proximity, or hovering input using an electronic pen or the user's body part.

The communication interface 170, for example, may set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106).

The wireless communication may use at least one of, for example, Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), and Global System for Mobile Communications (GSM), as a cellular communication protocol. In addition, the wireless communication may include, for example, short range communication 164. The short-range communication 164 may be performed by using at least one of, for example, Wi-Fi, Bluetooth, Bluetooth low energy (BLE), Near Field Communication (NFC), and Global Navigation Satellite System (GNSS). The GNSS may include at least one of, for example, a Global Positioning System (GPS), a Global Navigation Satellite System (Glonass), a Beidou Navigation Satellite System (hereinafter referred to as "Beidou"), and a European Global Satellite-based Navigation System (Galileo), according to a use area, a bandwidth, or the like. Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one of a communication network such as a computer network (e.g., a LAN or a WAN), the Internet, and a telephone network.

Each of the first and second external electronic apparatuses 102 and 104 may be of a type identical to or different from that of the electronic apparatus 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic apparatus may execute the requested functions or the additional functions, and may deliver a result of the execution to the electronic apparatus 101. The electronic device 101 may process the received result as it is or additionally to provide the requested functions or services. To achieve this, for example, cloud computing, distributed computing, or client-server computing technology may be used.

FIG. 2 is a block diagram illustrating an electronic device according to various embodiments of the present disclosure.

FIG. 2 is a block diagram of an electronic device 201 according to various embodiments. For example, the electronic apparatus 201 may include the whole or part of the electronic apparatus 101 illustrated in FIG. 1. The electronic device 201 may include at least one processor (e.g., Application Processor (AP)) 210, a communication module 220, a Subscriber identification Module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an operating system or an application program and perform processing of various pieces of data and calculations. The processor 210 may be implemented by, for example, a System on Chip (SoC). According to an embodiment, the processor 210 may further include a Graphic Processing Unit (GPU) and/or an image signal processor. The processor 210 may include at least some (e.g., a cellular module 221) of the elements illustrated in FIG. 2. The processor 210 may load, into a volatile memory, instructions or data received from at least one (e.g., a non-volatile memory) of the other elements and may process the loaded instructions or data, and may store various data in a non-volatile memory.

The communication module 220 may have a configuration equal or similar to that of the communication interface 170 of FIG. 1. The communication module 220 may include, for example, the cellular module 221, a Wi-Fi module 223, a Bluetooth (BT) module 225, a GNSS module 227 (e.g., a GPS module, a Glonass module, a Beidou module, or a Galileo module), an NFC module 228, and a Radio Frequency (RF) module 229.

The cellular module 221 may provide a voice call, image call, a text message service, or an Internet service through, for example, a communication network. According to an embodiment, the cellular module 221 may distinguish between and authenticate electronic devices 201 within a communication network using a subscriber identification module (for example, the SIM card 224). According to an embodiment of the present disclosure, the cellular module 221 may perform at least some of the functions that the processor 210 may provide. According to an embodiment, the cellular module 221 may include a Communication Processor (CP).

Each of the Wi-Fi module 223, the BT module 225, the GNSS module 227, and the NFC module 228 may include, for example, a processor for processing data transmitted and received through the relevant module. According to some embodiments of the present disclosure, at least some (e.g., two or more) of the cellular module 221, the Wi-Fi module 223, the BT module 225, the GNSS module 227, and the NFC module 228 may be included in one Integrated Chip (IC) or IC package.

The RF module 229 may transmit/receive, for example, a communication signal (for example, an RF signal). The RF module 229 may include, for example, a transceiver, a Power Amplifier Module (PAM), a frequency filter, a Low Noise Amplifier (LNA), and an antenna.

According to another embodiment of the present disclosure, at least one of the cellular module 221, the Wi-Fi module 223, the BT module 225, the GNSS module 227, and the NFC module 228 may transmit and receive RF signals through a separate RF module.

The subscriber identification module 224 may include, for example, a card including a subscriber identity module and/or an embedded SIM, and may contain unique identification information (e.g., an Integrated Circuit Card Identifier (ICCID)) or subscriber information (e.g., an International Mobile Subscriber Identity (IMSI)).

The memory 230 (for example, the memory 130) may include, for example, an internal memory 232 or an external memory 234. The embedded memory 232 may include at least one of a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (for example, a NAND flash memory or a NOR flash memory), a hard disc drive, a Solid State Drive (SSD), and the like).

The external memory 234 may further include a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 234 may be functionally and/or physically connected to the electronic apparatus 201 through various interfaces.

The sensor module 240 may measure a physical quantity or detect an operation state of the electronic device 201, and may convert the measured or detected information into an electrical signal. For example, the sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a Red/Green/Blue (RGB) sensor), a bio-sensor 240I, a temperature/humidity sensor 240J, a light sensor 240K, and an Ultra Violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 240 may further include a control circuit for controlling one or more sensors included therein. In some embodiments of the present disclosure, the electronic apparatus 201 may further include a processor configured to control the sensor module 240 as a part of or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. Also, the touch panel 252 may further include a control circuit. The touch panel 252 may further include a tactile layer and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect ultrasonic wavers generated by an input tool through a microphone (for example, a microphone 288) and identify data corresponding to the detected ultrasonic waves.

The display 260 (for example, the display 160) may include a panel 262, a hologram device 264 or a projector 266. The panel 262 may include a configuration that is identical or similar to the display 160 illustrated in FIG. 1. The panel 262 may be implemented to be, for example, flexible, transparent, or wearable. The panel 262 and the touch panel 252 may be implemented as one module. The hologram 264 may show a three dimensional image in the air by using an interference of light. The projector 266 may display an image by projecting light onto a screen. The screen may be located, for example, inside or outside the electronic apparatus 201. According to an embodiment, the display 260 may further include a control circuit for controlling the panel 262, the hologram device 264, or the projector 266.

The interface 270 may include, for example, a High-Definition Multimedia Interface (HDMI) 272, a Universal Serial Bus (USB) 274, an optical interface 276, or a D-subminiature (D-sub) 278. The interface 270 may be included in, for example, the communication interface 170 illustrated in FIG. 1. Additionally or alternatively, the interface 270 may include, for example, a Mobile High-definition Link (MHL) interface, a Secure Digital (SD) card/Multi-Media Card (MMC) interface, or an Infrared Data Association (IrDA) standard interface.

The audio module 280 may bilaterally convert, for example, a sound and an electrical signal. At least some elements of the audio module 280 may be included in, for example, the input/output interface 145 illustrated in FIG. 1. The audio module 280 may process sound information which is input or output through, for example, a speaker 282, a receiver 284, earphones 286, the microphone 288 or the like.

The camera module 291 is a device which may photograph a still image and a dynamic image. According to an embodiment, the camera module 291 may include one or more image sensors (for example, a front sensor or a back sensor), a lens, an Image Signal Processor (ISP) or a flash (for example, LED or xenon lamp).

The power management module 295 may manage, for example, power of the electronic device 201. According to an embodiment, the power management module 295 may include a Power Management Integrated Circuit (PMIC), a charger Integrated Circuit (IC), or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature during the charging. The battery 296 may include, for example, a rechargeable battery or a solar battery.

When the electronic device 200 is supplied with power through a charging apparatus and the battery 296 is not properly connected to (or does not come in proper contact with) a terminal of a battery connector, an over-current or over-discharge, may occur. FIGS. 3-9 will describe apparatuses and methods that may alleviate the foregoing.

The indicator 297 may display a particular state (e.g., a booting state, a message state, a charging state, or the like) of the electronic apparatus 201 or a part (e.g., the processor 210). The motor 298 may convert an electrical signal into mechanical vibration, and may generate vibration, a haptic effect, or the like. Although not illustrated, the electronic apparatus 201 may include a processing unit (e.g., a GPU) for supporting a mobile television (TV). The processing unit for supporting mobile TV may, for example, process media data according to a certain standard such as Digital Multimedia Broadcasting (DMB), Digital Video Broadcasting (DVB), or mediaFLO™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 3:
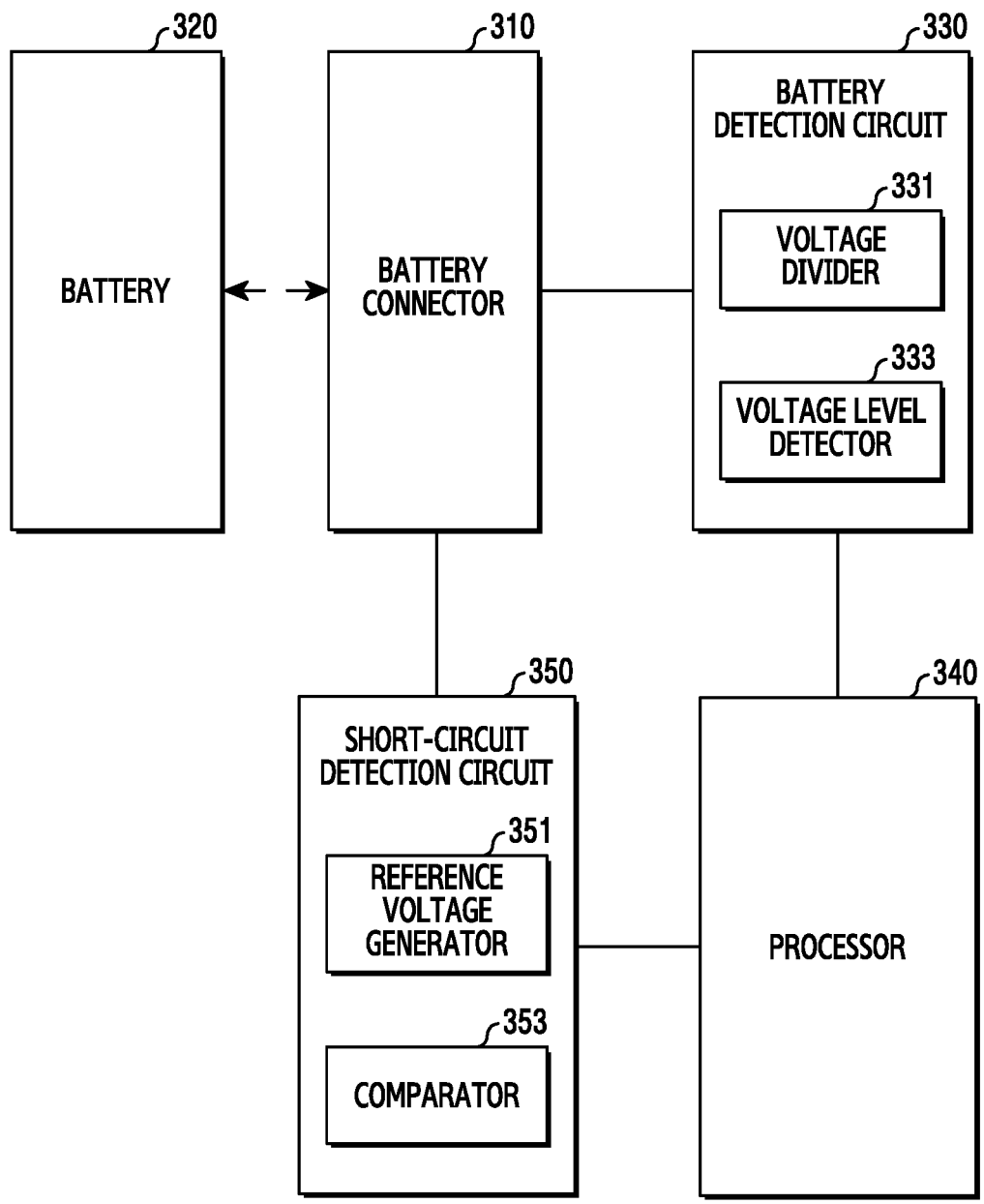
FIG. 3 is a block diagram for explaining a method for controlling an operation of a battery according to various embodiments.

FIG. 3 is a block diagram for controlling an operation of a battery according to various embodiments.

In various embodiments, an electronic device 101 (e.g., the processor 120 or 210) may determine whether one of three possibilities is present—(1) a battery (e.g., the battery 296) is not connected to a battery connector (or a state in which the battery is not mounted to the electronic device 101), (2) the battery is properly (or, normally) connected to the battery connector, or (3) the battery is connected, but not properly (or, abnormally) connected to the battery connector.

Determination of whether the battery 320 is or is not connected to the battery connector 310 can be determined by the battery connector 310. Determination that that battery is or is not properly connected to the battery can be detected by the short circuit detection circuit 350 determining whether a battery ID terminal is grounded (including whether a short circuit has formed between the battery ID terminal and the ground).

Hereinafter, a determination that the battery is properly connected to a battery connector may refer to multiple terminals of the battery connector normally connected to (normally come in contact with) multiple terminals of the battery corresponding to the multiple terminals of the battery connector.

A determination that the battery is connected, but not properly (or, abnormally), may refer to the battery ID terminal short to the ground and at least some of multiple terminals of a battery connector being in contact with at least some of multiple terminals of a battery. In various embodiments, a battery ID terminal of a battery connector may be short to a ground terminal (or a negative terminal) among multiple terminals of a battery, or may be short to the ground (or a negative terminal of the battery connector) of a Printed-Circuit Board (PCB) of the electronic device 101. In an embodiment, a battery ID terminal may be short to the ground due to some cause, for example, a case where a foreign object is inserted in the battery ID terminal, or a case where physical force is applied to the battery ID terminal. However, a cause due to which the battery ID terminal is short to the ground is not limited to the above-described examples.

In various embodiments, a determination that the battery is connected to a battery connector or a state in which a battery ID terminal is grounded may correspond to when the battery is mounted to the electronic device 101. When the battery is not connected to the battery connector may correspond to a determination in which the battery is not mounted to the electronic device 101.

Referring to FIG. 3, the electronic device 101 may comprise a battery connector 310, a battery 320 (e.g., the battery 296), a battery detection circuit 330, a short-circuit detection circuit 350, a processor 340 (e.g., the processor 120 or 210). In various embodiments, although not illustrated in FIG. 3, the electronic device 101 illustrated in FIG. 3 may further include at least some of the elements of the electronic device 201 illustrated in FIG. 2.

In an embodiment, the battery connector 310 may include multiple terminals connectable to the battery 320. For example, the battery connector 310 may include a positive terminal (or (+) terminal), a negative terminal (or (−) terminal, or a ground terminal), and a battery ID terminal configured to identify the battery 320. In another example, the battery connector 310 may further include a Near Field Communication (NFC) terminal capable of supporting NFC, as well as the positive terminal, the negative terminal, and the battery ID terminal. However, the present disclosure is not limited thereto.

In an embodiment, the electronic device 101 may charge or discharge the battery 320 through the positive terminal and the negative terminal. For example, the electronic device 101 may deliver power, which is input from an external apparatus (e.g., a charging apparatus), to the battery 320 through the positive terminal and the negative terminal. In another example, the electronic device 101 may receive power, which is supplied from the battery 320, to a system (e.g., the display 160 or the communication module 170) through the positive terminal and the negative terminal. However, the present disclosure is not limited thereto.

In an embodiment, the electronic device 101 (e.g., the power management module 295) may check a remaining charge amount of the battery 320, or may determine a charging current for charging the battery 320 through the battery ID terminal. For example, the electronic device 101 may check the present voltage of the battery 320 based at least partly on the voltage measured at the battery ID terminal. In another example, the electronic device 101 may determine a charging current for charging the battery 320 based at least partly on the present voltage of the battery 320. However, the present disclosure is not limited thereto.

In an embodiment, the battery 320 may be mounted to or detached from (or detached from or attached to) the electronic device 101. For example, the battery 320 may be mounted to or detached from the designated position of the electronic device 101. However, the present disclosure is not limited thereto.

In an embodiment, the battery 320 may include multiple terminals configured to be connected to the battery connector 310. For example, the battery 320 may include multiple terminals corresponding to multiple terminals of the battery connector 310. In an embodiment, when the battery 320 is mounted to the electronic device 101, multiple terminals of the battery 320 may be connected to (or come in contact with) multiple corresponding terminals of the battery connector 310 For example, a positive terminal of the battery 320 may be connected to a positive terminal of the battery connector 310, a negative terminal of the battery 320 may be connected to a negative terminal of the battery connector 310, and an ID terminal of the battery 320 may be connected to an ID terminal of the battery connector 310.

In an embodiment, the battery 320 may include a resistor (hereinafter referred to as a "battery resistor") (not illustrated) connectable to the battery ID terminal of the battery connector 310. In an embodiment, the electronic device 101 may determine (distinguish from another type) the type of battery 320 connected to the electronic device 101 based at least partly on a voltage measured across the battery resistor. In another embodiment, the electronic device 101 may determine whether the battery 320 connected to the electronic device 101 is a designated battery 320 (e.g., a regular battery 320), based at least partly on a voltage measured across the battery resistor. For example, the battery resistor may have a unique resistance according to the type of battery 320 or the manufacturer thereof. The electronic device 101 may determine whether the battery 320 is a designated battery, by checking the unique resistance of the battery resistor (or a voltage applied thereto).

Detecting Whether the Battery is/is not Connected

In an embodiment, the battery detection circuit 330 may detect whether the battery 320 is connected to the battery connector 310. In order to detect whether the battery 320 is connected to the battery connector 310, the battery detection circuit 330 may include a voltage divider 331 and a voltage level detector 333.

In an embodiment, the voltage divider 331 may include a pull-up resistor, and may divide a voltage, which is input from a power source (or a voltage source) (e.g., Vbus, Vcc, or Vdd), by using the pull-up resistor. For example, using a pull-up resistor having a designated resistance, the voltage divider 331 may divide a voltage, which is input from a power source, such that the voltage is applied, at the designated ratio, to the pull-up resistor and a battery resistor connected to the pull-up resistor (or in view of the pull-up resistor and the battery resistor).

In an embodiment, the pull-up resistor may be connected to the battery ID terminal, and when the battery 320 is not connected to the battery connector 310 (or when the battery 320 is not mounted to the electronic device 101), the pull-up resistor may have a resistance which causes a voltage (hereinafter referred to as a "first voltage"), measured at the battery ID terminal, to fall within a designated range or exceed a designated threshold. For example, the pull-up resistor may have a resistance which causes the voltage level detector 333 to recognize (or check) the first voltage as a voltage corresponding to, for example, a high level.

In an embodiment, the pull-up resistor may have a resistance which causes each of a second voltage and a third voltage to fall within a designated range or be less than or equal to a designated threshold, wherein the second voltage is measured at the battery ID terminal when the battery 320 is connected to the battery connector 310, and the third voltage is measured at the battery ID terminal when the battery ID terminal is short to the ground. For example, the pull-up resistor may have a resistance which causes the voltage level detector 333 to recognize the second and third voltages as, for example, a low-level voltage.

In an embodiment, the pull-up resistor may have a resistance which causes the difference between the second and third voltages to be the largest. In an embodiment, the pull-up resistor may have a resistance which causes the difference between the second and third voltages to be the largest, and thus enables the electronic device 101 to accurately determine (recognize) a case where the battery 320 is connected to the battery connector 310 and a case where the battery ID terminal is short to the ground.

In an embodiment, the pull-up resistor may have a resistance which: causes the first voltage to have a high level; and not only causes the second and third voltages to both have a low level, but also causes the difference between the second and third voltages to be the largest.

In an embodiment, the battery detection circuit 330 may, via the voltage level detector 333 (or a low/high detector), detect whether the battery 320 is connected to the battery connector 310 (or whether the battery 320 is mounted to the electronic device 101), based at least partly on a voltage (or a voltage level) measured at the battery ID terminal. For example, the voltage level detector 333 may recognize (or read, or check), as a high-level voltage, the first voltage which exceeds a designated threshold (or which is in a designated range of voltages exceeding the designated threshold), and may recognize, as low-level voltages, the second and third voltages which are less than or equal to the designated threshold (or which are in a designated range of voltages less than or equal to the designated threshold). In an embodiment, when the voltage measured at the battery ID terminal is recognized to have a high level, the battery detection circuit 330 may determine that the battery 320 is not connected to the battery connector 310, and when the voltage measured at the battery ID terminal is recognized to have a low level, the battery detection circuit 330 may determine that the battery 320 is connected to the battery connector 310. However, the present disclosure is not limited thereto.

In an embodiment, the voltage level detector 333 may predetermine a voltage range or a threshold such that the voltage measured at the battery ID terminal is recognized to have a high or low level.

In an embodiment, the battery detection circuit 330 may generate a signal (hereinafter referred to as a "first signal") indicating whether the battery 320 is connected to the battery connector 310, and may deliver (or transmit) the same to the processor 340. For example, when a voltage measured at the battery ID terminal is recognized to have a high level, the battery detection circuit 330 may generate a first signal including information indicating that the battery 320 is not connected to the battery connector 310, and may transmit the same to the processor 340. In another example, when the voltage measured at the battery ID terminal is recognized to have a low level, the battery detection circuit 330 may generate a first signal including information indicating that the battery 320 is connected to the battery connector 310, and may transmit the same to the processor 340.

In an embodiment, the battery detection circuit 330 may be included in a Power Management Integrated Circuit (PMIC), or may be an element configured independently of the PMIC. In another embodiment, the voltage divider 331 may be included in the battery connector 310, and the voltage level detector 333 may be included in a PMIC. In still another embodiment, the voltage divider 331 may be an element configured independently of the battery connector 310 and a PMIC, and the voltage level detector 333 may be included in the PMIC.

Detecting Whether the Battery is Properly Connected

In an embodiment, the short-circuit detection circuit 350 may detect whether the battery ID terminal is short to the ground. When the battery detection circuit 330 detects that the battery 320 is connected to the battery connector 310, and the short-circuit detection circuit 350 does not detect that the battery ID terminal is short to the ground, the battery 320 can be detected as properly connected to battery connector 310. When the battery detection circuit 330 detects that the battery 320 is connected to the battery connector 310, and the short-circuit detection circuit 350 detects that the battery ID terminal is short to the ground, the battery 320 can be detected as not properly connected to battery connector 310.

In order to detect that the battery 320 is connected to the battery connector 310 or the battery ID terminal is short to the ground, the short-circuit detection circuit 350 may include a reference voltage generator 351 and a comparator 353.

In an embodiment, the reference voltage generator 351 may generate a reference voltage (or a comparative voltage) for comparison with a voltage measured at the battery ID terminal. In an embodiment, a reference voltage may be a voltage for distinguishing a second voltage from a third voltage. For example, a reference voltage may be a voltage which is higher than a second voltage and is lower than a third voltage. However, the present disclosure is not limited thereto. In an embodiment, the reference voltage generator 351 may deliver the generated reference voltage to an input terminal of the comparator 353.

In an embodiment, the comparator 353 may receive, as input, a voltage measured at the battery ID terminal and a reference voltage, and may output a corresponding voltage (hereinafter referred to as a "second signal") by comparing the voltage measured at the battery ID terminal and the reference voltage which are received as input. For example, in a state in which the battery 320 is connected to the battery connector 310, the comparator 353 may output a voltage that the processor 340 is to recognize as, for example, a low-level voltage, by comparing a second voltage with the reference voltage. In another example, in a state in which the battery ID terminal is short to the ground, the comparator 353 may output a voltage that the processor 340 is to recognize as, for example, a high-level voltage, by comparing a third voltage with the reference voltage. In an embodiment, the comparator 353 may deliver the second signal to an interrupt pin (or an interrupt terminal) of the processor 340.

In an embodiment, the processor 340 may determine whether the battery 320 is connected to the battery connector 310 and whether the battery ID terminal is short to the ground. For example, the processor 340 may determine whether the battery 320 is connected to the battery connector 310, based at least partly on a first signal delivered from the battery detection circuit 330. The processor 340 may determine whether the battery 320 is properly connected to the battery connector 310 or improperly connected to the battery connector 310, based at least partly on a second signal delivered from the short-circuit detection circuit 350.

In an embodiment, when the battery 320 is determined to be connected to the battery connector 310 based at least partly on the first signal, the processor 340 may determine whether the battery 320 is in the state of being properly connected to the battery connector 310 or improperly connected to the battery connector 310, based at least partly on the second signal. For example, when the battery 320 is determined not to be connected to the battery connector 310, the processor 340 may not determine whether the battery 320 is properly or improperly connected to the battery connector 310. Only when the battery 320 is determined to be connected to the battery connector 310, the processor 340 may determine whether the battery 320 is in the state of being properly or improperly connected to the battery connector 310.

In another embodiment, based at least partly on a first signal and a second signal, the processor 340 may determine whether the battery 320 is not connected to the battery connector 310, whether the battery 320 is properly connected to the battery connector 310, or whether the battery 320 is not properly connected to the battery connector 310. For example, the processor 340 may acquire a first signal and a second signal, and may determine, by considering both of the acquired first and second signals, whether the battery 320 is in the state of not being connected to the battery connector 310, whether the battery 320 is properly connected to the battery connector 310, or whether the battery 320 is not properly connected to the battery connector 310.

In an embodiment, the processor 340 may control an operation of the battery 320 based at least partly on whether the battery 320 is in the state of not being connected to the battery connector 310, whether the battery 320 is properly connected to the battery connector 310, or whether the battery 320 is not properly connected to the battery connector 310.

For example, when an external apparatus (e.g., a charging apparatus) is connected to the electronic device 101 and the battery 320 is properly connected to the battery connector 310, the processor 340 may perform an operation of charging the battery 320 by using power supplied from the external apparatus (e.g., a charging apparatus).

In another example, when the external apparatus (e.g., a charging apparatus) is connected to the electronic device 101 and the battery 320 is not properly connected to the battery connector 310, the processor 340 may perform an operation of limiting an operation of charging the battery 320. For example, the processor 340 may cut off power supplied to the battery 320 from the external apparatus (e.g., a charging apparatus) by using at least one switch element. According to an embodiment, the processor 340 may reduce power, which is supplied to the battery 320 from the external apparatus, by using the power management module 295. However, the present disclosure is not limited thereto.

In still another example, when the battery is not properly connected to the battery connector 310, the processor 340 may limit power supply from the battery 320 to the system.

In yet another example, when the battery ID terminal is in the state of being short to the ground and an On-The-Go (OTG) apparatus is connected to the electronic device 101, the processor 340 may limit power supplied to the OTG apparatus from the battery 320.

Figure 4:
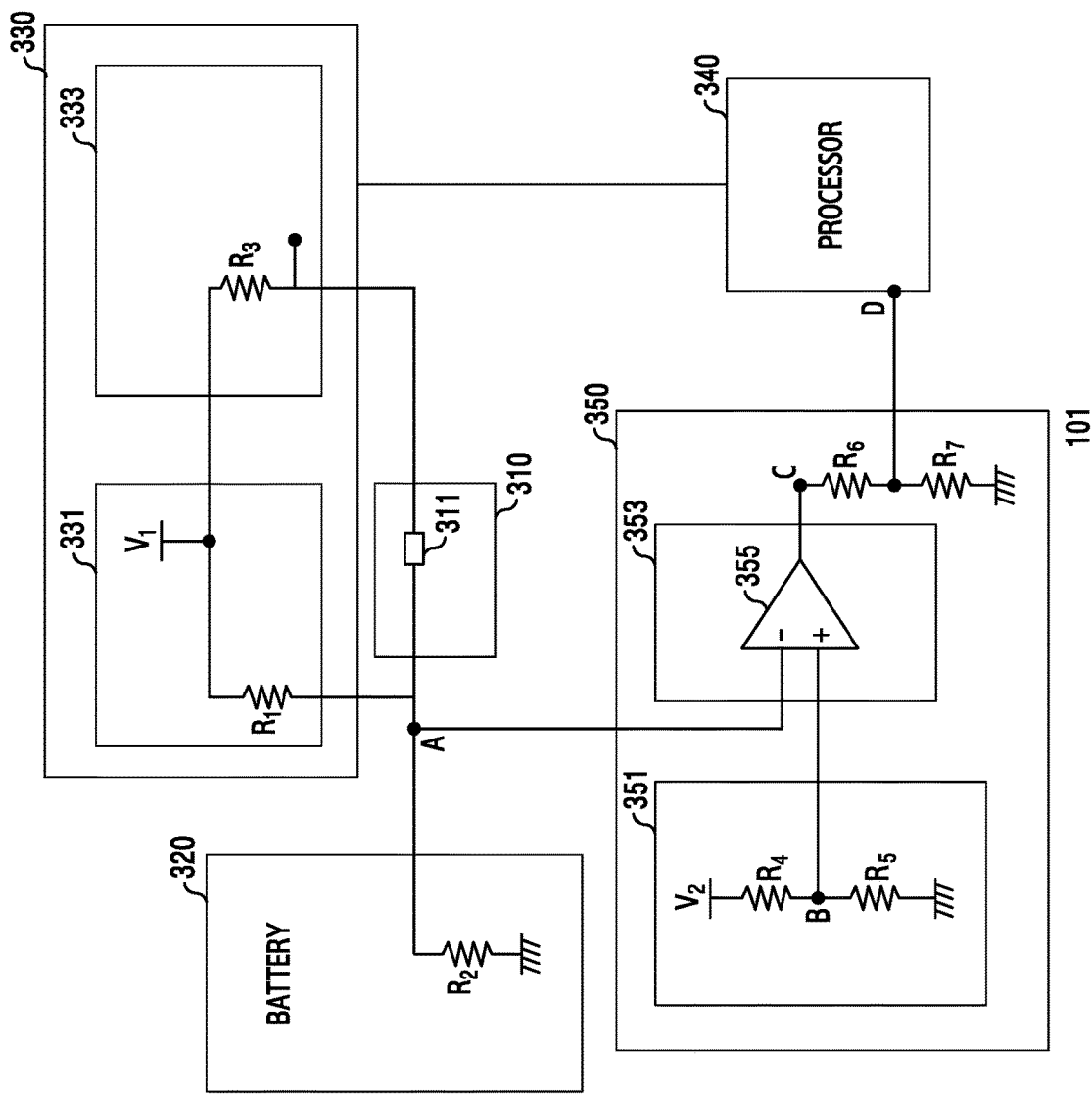
FIG. 4 is a circuit diagram for explaining a method for controlling an operation of a battery according to various embodiments.

FIG. 4 is a circuit diagram for explaining a method for controlling an operation of a battery according to various embodiments.

Referring to FIG. 4, the electronic device 101 may comprise the battery connector 310, the battery 320 (e.g., the battery 296), the battery detection circuit 330, the short-circuit detection circuit 350, and the processor 340 (e.g., the processor 120 or 210).

In an embodiment, the battery connector 310 may be connectable to the battery 320, and may include multiple terminals including a battery ID terminal 311.

In an embodiment, in a state in which the battery 320 is not connected to the battery connector 310, the battery ID terminal 311 may be connected to a pull-up resistor R1, an internal resistor R3 (or an internal pull-up resistor) of the voltage level detector 333, and an inverting (or negative) input terminal of an operational amplifier (op-amp) 355.

In another embodiment, in a state in which the battery 320 is connected to the battery connector 310, the battery ID terminal 311 may be connected to an internal resistor R3 of the voltage level detector 333, and at node A, may be connected to a pull-up resistor R1, an inverting input terminal of an op-amp 355, and a battery resistor R2.

In still another embodiment, when the battery ID terminal 311 is short to the ground, the battery ID terminal 311 may be connected to an internal resistor R3 of the voltage level detector 333, and at node A, may be connected to a pull-up resistor R1, an inverting input terminal of an op-amp 355, a battery resistor R2, and the ground (or a ground terminal) connected in parallel to the battery resistor R2. However, the present disclosure is not limited thereto. For example, when the battery ID terminal 311 is short to the ground, at node A, the battery ID terminal 311 may be connected to the pull-up resistor R1, the inverting input terminal of the op-amp 355, and the ground (or the ground terminal) without being connected to the battery resistor R2.

In an embodiment, the battery 320 may include: the battery resistor R2; and multiple terminals configured to be connected to the battery connector 310, including the battery ID terminal 311 and a terminal connected to the battery resistor R2. In an embodiment, the battery resistor R2 may have a unique resistance.

In an embodiment, the voltage divider 331 may include the pull-up resistor R1, and may divide a voltage, which is input from a power source V1 (e.g., Vbus, Vcc, or Vdd), by using the pull-up resistor R1. For example, in the state in which the battery 320 is connected to the battery connector 310, the voltage divider 331 may divide a voltage such that the voltage is applied, at the designated ratio, to the pull-up resistor R1 and the battery resistor R2 connected in series to the pull-up resistor R1. In another example, in the state in which the battery ID terminal 311 is short to the ground, the voltage divider 331 may divide a voltage such that the voltage is applied only to the pull-up resistor R1.

In an embodiment, the pull-up resistor R1 may be connected to the battery ID terminal 311, and when the battery 320 is not connected to the battery connector 310 (or when the battery 320 is not mounted to the electronic device 101), the pull-up resistor R1 may have a resistance which causes a first voltage measured at the battery ID terminal 311 to fall within a designated range or exceed a designated threshold. For example, the pull-up resistor R1 may have a resistance which causes the voltage level detector 333 to recognize the first voltage as, for example, a high-level voltage.

In an embodiment, when the battery 320 is connected to the battery connector 310, the pull-up resistor R1 may have a resistance which causes a second voltage measured at the battery ID terminal 311 to fall within a designated range or be less than or equal to a designated threshold. For example, when the battery 320 is connected to the battery connector 310, the pull-up resistor R1 may have a resistance which causes the voltage level detector 333 to recognize the second voltage as, for example, a low-level voltage.

For example, when consideration is given to a case where: a power source V1 has a voltage ranging between 3.8 and 5 volts; the battery resistor has a resistance of 2.4 kohms; and the voltage level detector 333 recognizes a voltage ranging between 0 and 0.3 volts as a low-level voltage, and recognizes a voltage higher than or equal to 0.3 volts as a high-level voltage, the pull-up resistor R1 may be implemented by a resistor having a resistance (e.g., 43 kohms) larger than or equal to 37.6 kohms.

In an embodiment, the pull-up resistor R1 may have a resistance which causes the difference between a second voltage and a third voltage, which is measured at the battery ID terminal 311 when the battery ID terminal 311 is connected to the ground, to be the largest.

In an embodiment, the pull-up resistor R1 may have a resistance which causes a first voltage to have a high level, and not only causes a second voltage and a third voltage to both have a low level, but also causes the difference between the second and third voltages to be the largest. For example, according to the above-described consideration, the pull-up resistor R1 may be implemented to have 37.6 kohms such that the same causes the difference between the second and third voltages to be the largest while having a resistance larger than or equal to 37.6 kohms.

In an embodiment, the pull-up resistor R1 may be connected in parallel to the internal resistor R3 included in the voltage level detector 333. In an embodiment, the internal resistor R3 may be implemented to have a resistance (e.g., 2.5 Mohms) larger than the resistances of the pull-up resistor R1 and the battery resistor R2. In an embodiment, when the internal resistor R3 having a resistance larger than that of the battery resistor R2 is implemented in the voltage level detector 333, in order to accurately distinguish, from another state, a state in which the battery 320 is connected to the battery connector 310 or a state in which the battery ID terminal 311 is short to the ground, the voltage divider 331 including the pull-up resistor R1 may be implemented in the electronic device 101.

In an embodiment, the voltage level detector 333 (or a low/high detector) may detect whether the battery 320 is connected to the battery connector 310 (whether the battery 320 is mounted to the electronic device 101), based at least partly on a voltage (or a voltage level) measured at the battery ID terminal 311.

In an embodiment, the voltage level detector 333 may include the pull-up resistor R1 and the internal resistor R3 having a resistance larger than that of the battery resistor R2. However, the present disclosure is not limited thereto, and the voltage level detector 333 may not include the internal resistor R3.

In an embodiment, the battery detection circuit 330 may generate a signal (hereinafter referred to as a "first signal") related to whether the battery 320 is connected to the battery connector 310, and may deliver (or provide) the same to the processor 340.

In an embodiment, the short-circuit detection circuit 350 may detect the state in which the battery 320 is properly connected to the battery connector 310, or when the the battery ID terminal 311 is short to the ground that the battery 320 is improperly connected to the battery connector 310. In order to detect the state in which the battery 320 is connected to the battery connector 310 or the state in which the battery ID terminal 311 is short to the ground, the short-circuit detection circuit 350 may include the reference voltage generator 351 and the comparator 353.

In an embodiment, the reference voltage generator 351 may generate a reference voltage (or a comparative voltage) for comparison with a voltage measured at the battery ID terminal 311. In an embodiment, a reference voltage may be a voltage for distinguishing a second voltage from a third voltage. For example, a reference voltage may be higher than a second voltage and may be lower than a third voltage. However, the present disclosure is not limited thereto. In an embodiment, the reference voltage generator 351 may deliver the generated reference voltage to an input terminal (e.g., a non-inverting terminal) of the comparator 353.

In an embodiment, the reference voltage generator 351 may include resistors R4 and R5 configured to divide a voltage which is input from a power source V2. In an embodiment, the reference voltage (e.g., the voltage at node B), which is obtained by a division operation of the resistors R4 and R5, may be input to the non-inverting terminal (or the positive terminal) of the op-amp 355 of the comparator 353.

In an embodiment, the comparator 353 may receive, as input, a voltage measured at the battery ID terminal 311 (or node A) and the reference voltage, and may output a corresponding voltage (hereinafter referred to as a "second signal") (e.g., a voltage at node C) by comparing the voltage measured at the battery ID terminal 311 with the reference voltage.

For example, in the state in which the battery 320 is connected to the battery connector 310, the comparator 353 may output a voltage that the processor 340 is to recognize as, for example, a low-level voltage, by comparing the second voltage and the reference voltage. In another example, in the state in which the battery ID terminal 311 is short to the ground, the comparator 353 may output a voltage that the processor 340 is to recognize as, for example, a high-level voltage, by comparing a third voltage with the reference voltage.

In an embodiment, Table 1 below shows examples of the voltages respectively measured at node A in the state in which the battery 320 is connected to the battery connector 310 and in the state in which the battery ID terminal 311 is short to the ground, according to the voltage level of a power source V1.

TABLE 1

| Voltage level of power source V1 | Voltage level measured at node A in state in which battery is connected to battery connector | Voltage level measured at node A in state in which battery ID terminal is short to ground |
|---|---|---|
| 4.56 V | 337 mV | 102 mV |
| 5.01 V | 390 mV | 121 mV |
| 4.86 V | 359 mV | 113 mV |

(In Table 1, 4.56 V may be the voltage level of a power source in the case where a travel adapter is connected to the electronic device 101 and a remaining charge amount of the battery 320 is 0%, 5.01 V may be the voltage level of a power source in the case where a Universal Serial Bus (USB) adapter is connected to the electronic device 101 and a remaining charge amount of the battery 320 is 95%, and 4.86 V may be the voltage level of a power source in the case where a travel adapter is connected to the electronic device 101 and a remaining charge amount of the battery 320 is 95%.

In an embodiment, the reference voltage generator 351 may generate a reference voltage having a voltage level (e.g., approximately 0.190 V) between a voltage level at node A, which is measured in the state in which the battery 320 is connected to the battery connector 310, and a voltage level at node A measured in the state in which the battery ID terminal 311 is short to the ground. In an embodiment, when the reference voltage generator 351 generates the above-described reference voltage and the voltages shown by way of example in Table 1 are measured at node A, the comparator 353 may output a second signal having a negative sign in the state in which the battery 320 is connected to the battery connector 310, and may output a second signal having a positive sign in the state in which the battery ID terminal 311 is short to the ground. However, the present disclosure is not limited thereto.

In an embodiment, when a second signal having a negative sign is input from the short-circuit detection circuit 350, the processor 340 may recognize the input second signal as a low-level signal, and may thus determine that the battery 320 is in the state of being connected to the battery connector 310.

In an embodiment, when a second signal having a positive sign is input from the short-circuit detection circuit 350, the processor 340 may recognize the input second signal as a high-level signal, and may thus determine that the battery ID terminal 311 is in the state of being short to the ground.

In FIG. 4, the comparator 353 is illustrated as including the op-amp 355 as an element configured to compare the voltage measured at the battery ID terminal 311 with a reference voltage, but the present disclosure is not limited thereto. For example, the comparator 353 may include an element capable of outputting a signal having a different level depending on whether an input is a second voltage or a third voltage, in place of the op-amp 355.

In an embodiment, the short-circuit detection circuit 350 may include resistors R6 and R7 configured to divide an output voltage of the comparator 353. However, the present disclosure is not limited thereto, and the resistors R6 and R7 may be omitted in some embodiments.

In an embodiment, the comparator 353 may deliver a second signal to an interrupt pin D (or an interrupt terminal) of the processor 340.

In an embodiment, the processor 340 may determine whether the battery 320 is connected to the battery connector 310 and whether the battery ID terminal 311 is short to the ground. For example, the processor 340 may determine whether the battery 320 is connected to the battery connector 310, based at least partly on a first signal delivered by the battery detection circuit 330. The processor 340 may determine whether the battery 320 is in the state of being connected to the battery connector 310 or whether the battery ID terminal 311 is in the state of being short to the ground, based at least partly on a second signal delivered by the short-circuit detection circuit 350.

In an embodiment, the processor 340 may control an operation of the battery 320 based at least partly on whether the battery 320 is in the state of not being connected to the battery connector 310, whether the battery 320 is in the state of being properly connected to the battery connector 310, or whether the battery 320 is improperly connected to the.

For example, when an external apparatus (e.g., a charging apparatus) is connected to the electronic device 101 and the battery 320 is in the state of being connected to the battery connector 310, the processor 340 may perform an operation of charging the battery 320 by using power supplied from the external apparatus (e.g., a charging apparatus).

In another example, when an external apparatus (e.g., a charging apparatus) is improperly connected to the electronic device 101, the processor 340 may perform an operation of limiting an operation of charging the battery 320. For example, the processor 340 may cut off power, which is supplied to the battery 320 from the external apparatus (e.g., a charging apparatus), by using at least one switch element. However, the present disclosure is not limited thereto.

In still another example, when the battery 320 is improperly connected, the processor 340 may limit power supply from the battery 320 to the system.

In yet another example, when the battery is improperly connected and an OTG apparatus is connected to the electronic device 101, the processor 340 may limit power supplied to the OTG apparatus from the battery 320.

Figure 5:
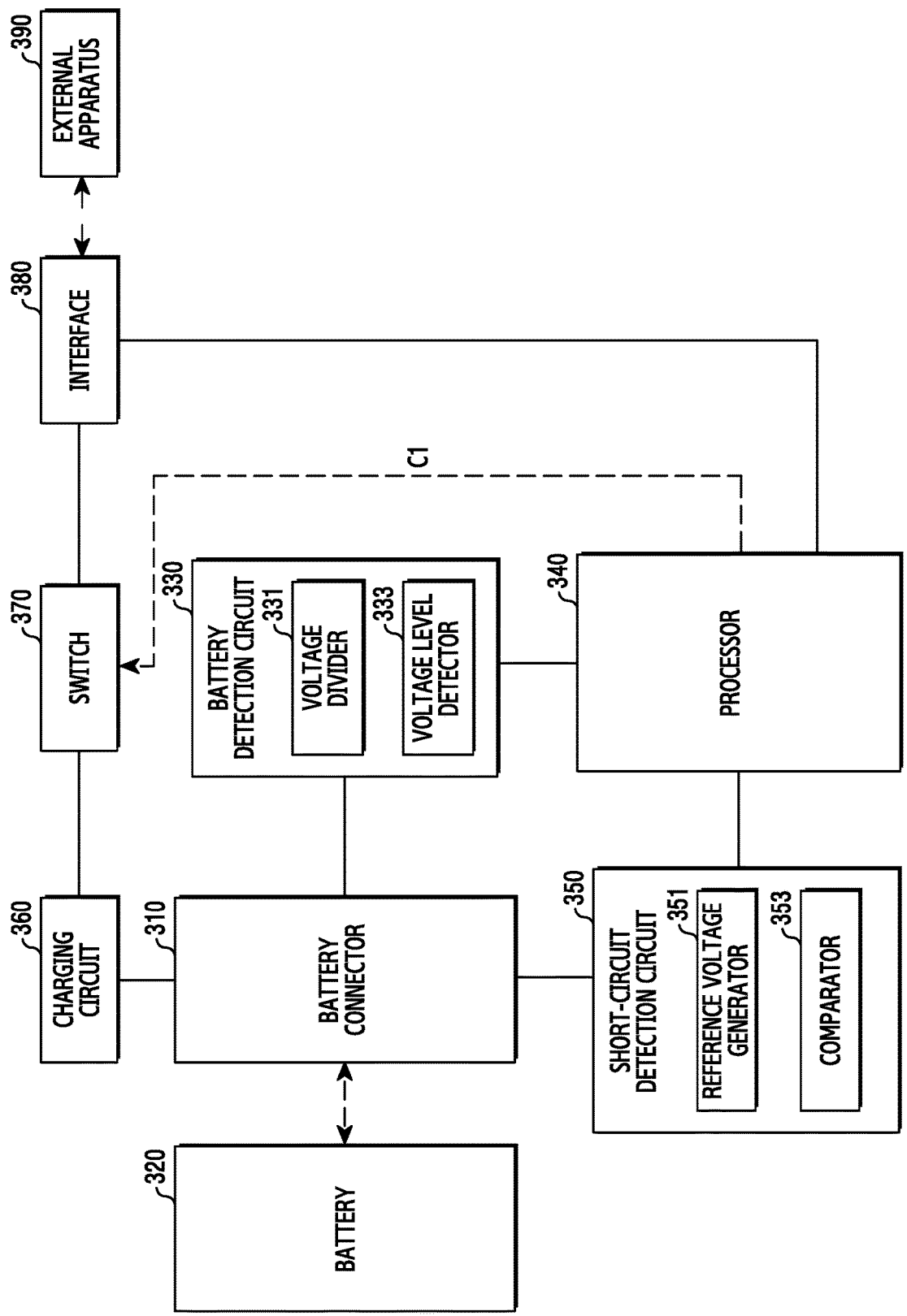
FIG. 5 is a block diagram for explaining a method for controlling, by an electronic device, an operation of charging a battery according to various embodiments.

FIG. 5 is a block diagram for explaining a method for controlling, by an electronic device, an operation of charging a battery according to various embodiments.

For example, FIG. 5 is block diagram for explaining a method for limiting, by the electronic device 101, power supplied to the battery 320 (e.g., the battery 296) from an external apparatus 390 (e.g., a charging apparatus) when the battery 296 is improperly connected to the battery connector 310.

Referring to FIG. 5, the electronic device 101 may include the battery connector 310, the battery 320, the battery detection circuit 330, the short-circuit detection circuit 350, the processor 340 (e.g., the processor 120 or 210), a charging circuit 360 (e.g., the power management module 295), a switch 370, an interface 380, and the like.

In various embodiments, the battery connector 310, the battery 320, the battery detection circuit 330, the short-circuit detection circuit 350, and the processor 340 of FIG. 5 are identical or similar at least in part to the battery connector 310, the battery 320, the battery detection circuit 330, the short-circuit detection circuit 350, and the processor 340 of FIG. 3, and thus, a detailed description thereof will be omitted.

In an embodiment, the charging circuit 360 may control power, which is to be supplied to the battery 320 from the external apparatus 390 or is to be supplied to the system from the battery 320, based at least partly on information (e.g., a remaining charge amount) of the battery 320 or information on the external apparatus 390 (e.g., information on whether the external apparatus 390 is a charging apparatus or an OTG apparatus) connected to the electronic device 101. For example, when the charging apparatus is connected to the interface 380, the charging circuit 360 may lower, boost, or identically output a voltage, which is input from the charging apparatus, according to the state of charge of the battery 320.

In an embodiment, the switch 370 may be connected to the charging circuit 360 and the interface 380, and may be closed or opened based at least partly on a control signal C1 received from the processor 340.

In an embodiment, the interface 380 (or a port) may be connected to the external apparatus 390, for example, a charging apparatus or an OTG apparatus.

In an embodiment, examples of the external apparatus 390 may include a charging apparatus and an OTG apparatus. In an embodiment, examples of the charging apparatus may include a travel adapter, a high-speed battery charger, a wireless charger, and a solar charger. However, the present disclosure is not limited thereto.

In an embodiment, when the battery 320 is in the state of being properly connected to the battery connector 310, the processor 340 may control the switch 370 such that power is supplied to the battery 320 from the external apparatus 390 (e.g., a charging apparatus). For example, the processor 340 may acquire information on whether the external apparatus 390 is connected to the electronic device 101 through the interface 380, and information on the type of external apparatus 390. When the charging apparatus is determined to be connected to the electronic device 101, the processor 340 may deliver, to the switch 370, a signal for closing the switch 370, so as to enable power to be supplied to the battery 320 from the external apparatus 390 through the interface 380, the switch 370, the charging circuit 360, and the battery connector 310.

In an embodiment, when the battery 320 is improperly connected to the battery connector 310, in order to limit power supply from the external apparatus 390 to the battery 320, the processor 340 may deliver, to the switch 370, a control signal C1 for opening the switch 370. In an embodiment, the switch 370 is opened, and thus, power supply from the external apparatus 390 to the battery 320 may be cut off.

Figure 6:
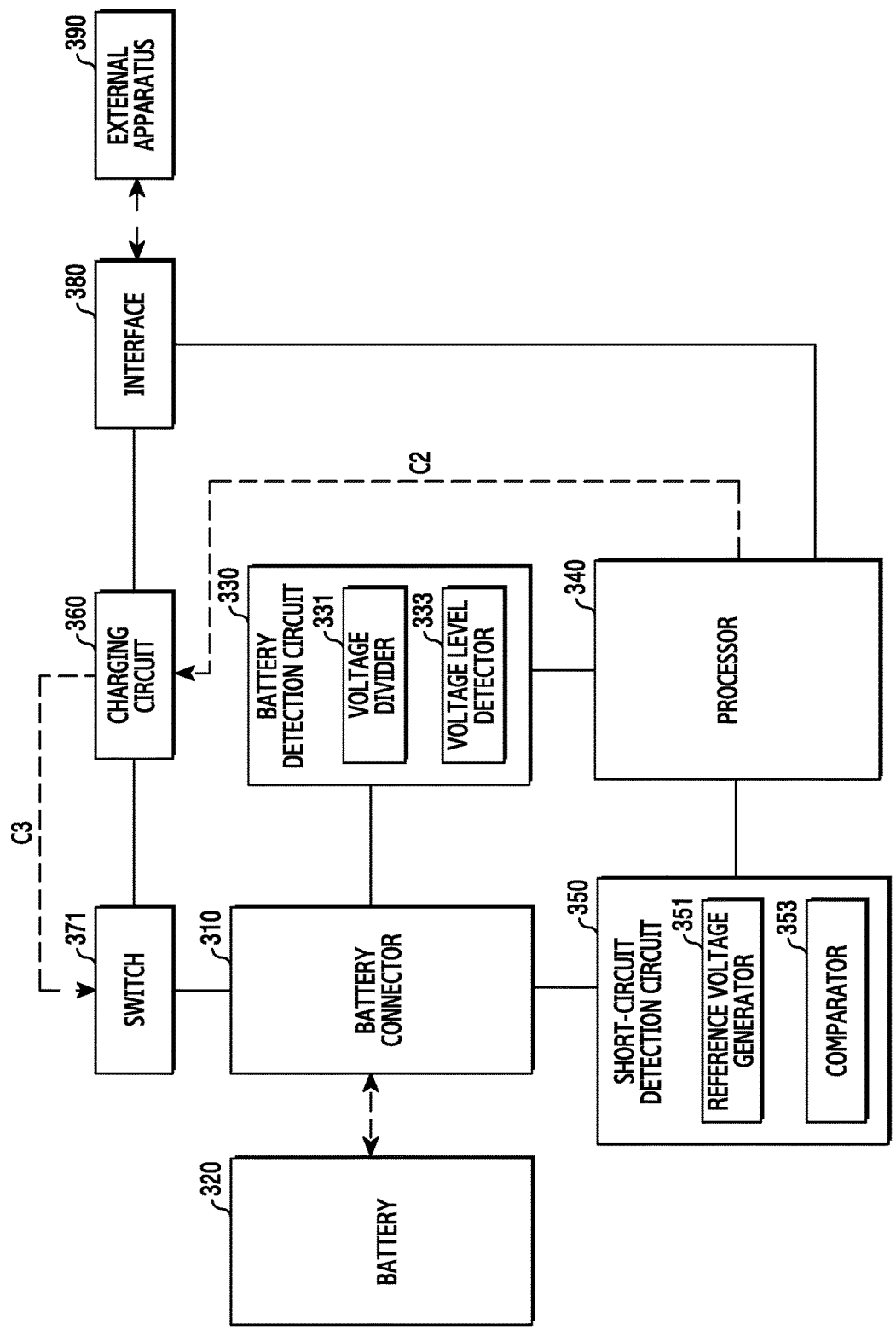
FIG. 6 is a block diagram for explaining a method for controlling, by an electronic device, an operation of charging a battery according to various embodiments.

FIG. 6 is a block diagram for explaining a method for controlling, by an electronic device, an operation of charging a battery according to various embodiments. For example, FIG. 6 is a block diagram for explaining a method for limiting, by the electronic device 101, power supplied to the battery 320 (e.g., the battery 296) from the external apparatus 390 (e.g., a charging apparatus) when the battery ID terminal is in the state of being improperly connected to the battery connector 310.

In various embodiments, the battery connector 310, the battery 320, the battery detection circuit 330, the short-circuit detection circuit 350, the processor 340, the charging circuit 360 (e.g., the power management module 295), a switch 371, and the interface 380 of FIG. 6 are identical or similar at least in part to the battery connector 310, the battery 320, the battery detection circuit 330, the short-circuit detection circuit 350, the processor 340, the charging circuit 360, the switch 370, and the interface 380 of FIG. 5, and thus, a detailed description thereof will be omitted.

Referring to FIG. 6, in an embodiment, the switch 371 may be connected to the charging circuit 360 and the battery connector 310.

In an embodiment, when the battery 320 is in the state of being connected to the battery connector 310, the processor 340 may control the switch 371 such that power is supplied to the battery 320 from the external apparatus 390 (e.g., a charging apparatus). For example, the processor 340 may acquire information on whether the external apparatus 390 is connected to the electronic device 101 through the interface 380, and information on the type of external apparatus 390. When a charging apparatus is determined to be connected to the electronic device 101, the processor 340 may deliver, to the charging circuit 360, a control signal C2 for closing the switch 371, and the charging circuit 360 may deliver the control signal C3 to the switch 371, so as to enable power to be supplied to the battery 320 from the external apparatus 390 through the interface 380, the charging circuit 360, the switch 371, and the battery connector 310.

In an embodiment, when the battery 320 is improperly connected to the battery connector 310, in order to limit power supply from the external apparatus 390 to the battery 320, the processor 340 may deliver, to the charging circuit 360, a control signal C2 for controlling opening of the switch 371. In an embodiment, when the charging circuit 360 receives the control signal C2, the charging circuit 360 may deliver, to the switch 371, a control signal C3 for opening the switch 371. In an embodiment, the switch 371 is opened, and thus, power supply from the external apparatus 390 to the battery 320 may be cut off.

An electronic device 101 according to various embodiments includes: a battery connector 310 including multiple terminals; a battery detection circuit 330 configured to detect whether a battery 320 is connected to the battery connector 310; a short-circuit detection circuit 350 configured to detect whether a battery identification (ID) terminal among the multiple terminals is short to a ground, based at least partly on a level of a voltage measured at the battery ID terminal and a predetermined voltage level; and a processor 340, wherein the processor 340 may be configured to: acquire, from the battery detection circuit 330, a first signal related to whether the battery 320 is connected to the battery connector 310; make a determination of whether the battery 320 is connected to the battery connector 310, based at least partly on the first signal; acquire, from the short-circuit detection circuit 350, a second signal related to whether the battery ID terminal is short to the ground; when the battery 320 is determined to be connected to the battery connector 310, make a determination of whether the battery 320 is improperly connected to the battery connector 310, based at least partly on the second signal; and control an operation of the battery 320 based at least partly on the determination of whether the battery ID terminal is short to the ground.

In various embodiments, when the battery 320 is determined to be connected to the battery connector 310, the processor 340 may be configured to determine, based at least partly on the second signal, whether the multiple terminals of the battery connector 310 are properly connected to multiple terminals of the battery 320 or improperly connected.

In various embodiments, the processor 340 may be configured to: detect that a charging apparatus is connected to the electronic device 101; and limit power supplied to the battery 320 from the charging apparatus when the battery 320 is improperly connected to the battery connector 310.

In various embodiments, the battery detection circuit 330 may include: a voltage divider 331 including a pull-up resistor; and a voltage level detector 333 configured to detect the level of the voltage measured at the battery ID terminal.

In various embodiments: when the battery 320 is connected to the battery connector 310, the voltage divider 331 may be configured to divide a voltage supplied from a power source such that the voltage is applied, at a designated ratio, to a resistor included in the battery 320 and the pull-up resistor; and the voltage level detector 333 may be configured to detect, based at least partly on a level of a voltage applied to the pull-up resistor, whether the battery 320 is connected to the battery connector 310, may be configured to generate the first signal based at least partly on a result of the detection, and may be configured to deliver the first signal to the processor 340.

In various embodiments, the pull-up resistor may be implemented to have a resistance which: when the multiple terminals of the battery connector 310 are normally connected to multiple terminals of the battery 320 and when the battery ID terminal is short to the ground, causes the voltage level detector 333 to recognize the voltage measured at the battery ID terminal as a high-level voltage; and when the battery 320 is not connected to the battery connector 310, causes the voltage level detector 333 to recognize the voltage measured at the battery ID terminal as a low-level voltage.

In various embodiments, the short-circuit detection circuit 350 may include: a reference voltage generator 351 configured to generate a reference voltage to be compared with the voltage measured at the battery ID terminal; and a comparator 353 configured to receive, as input, the voltage measured at the battery ID terminal and the reference voltage, generate the second signal based at least partly on a result of comparison of the voltage measured at the battery ID terminal with the reference voltage, and deliver the second signal to an interrupt pin of the processor 340.

In various embodiments, the reference voltage generator 351 may be configured to generate a reference voltage having a value between: a value of the voltage measured at the battery ID terminal when the multiple terminals of the battery connector 310 are normally connected to multiple terminals of the battery 320; and a value of the voltage measured at the battery ID terminal when the battery ID terminal is short to the ground.

An electronic device 101 according to various embodiments includes: a battery connector 310 including multiple terminals; a battery detection circuit 330 configured to detect whether a battery 320 is connected to the battery connector 310; a short-circuit detection circuit 350 configured to detect whether a battery Identification (ID) terminal among the multiple terminals is short to a ground, based at least partly on a level of a voltage measured at the battery ID terminal and a predetermined voltage level; and a processor 340, wherein the processor 340 may be configured to: acquire, from the battery detection circuit 330, a first signal related to whether the battery 320 is connected to the battery connector 310; acquire, from the short-circuit detection circuit 350, a second signal related to whether the battery ID terminal is short to the ground; make determinations of whether the battery 320 is connected to the battery connector 310 and whether the battery ID terminal is short to the ground, based at least partly on the first and second signals; and control an operation of the battery 320 based at least partly on a result of the determination.

In various embodiments, the processor 340 may be configured to: detect that a charging apparatus is connected to the electronic device 101; and limit power supplied to the battery 320 from the charging apparatus when the battery ID terminal is determined to be short to the ground.

In various embodiments, the battery detection circuit 330 may include: a voltage divider 331 including a pull-up resistor; and a voltage level detector 333 configured to detect the level of the voltage measured at the battery ID terminal.

In various embodiments, the short-circuit detection circuit 350 may include: a reference voltage generator 351 configured to generate a reference signal to be compared with the voltage measured at the battery ID terminal; and a comparator 353 configured to receive, as input, the voltage measured at the battery ID terminal and the reference signal, generate the second signal based at least partly on a result of comparison of the voltage measured at the battery ID terminal with the reference signal, and deliver the second signal to an interrupt pin of the processor 340.

Figure 7:
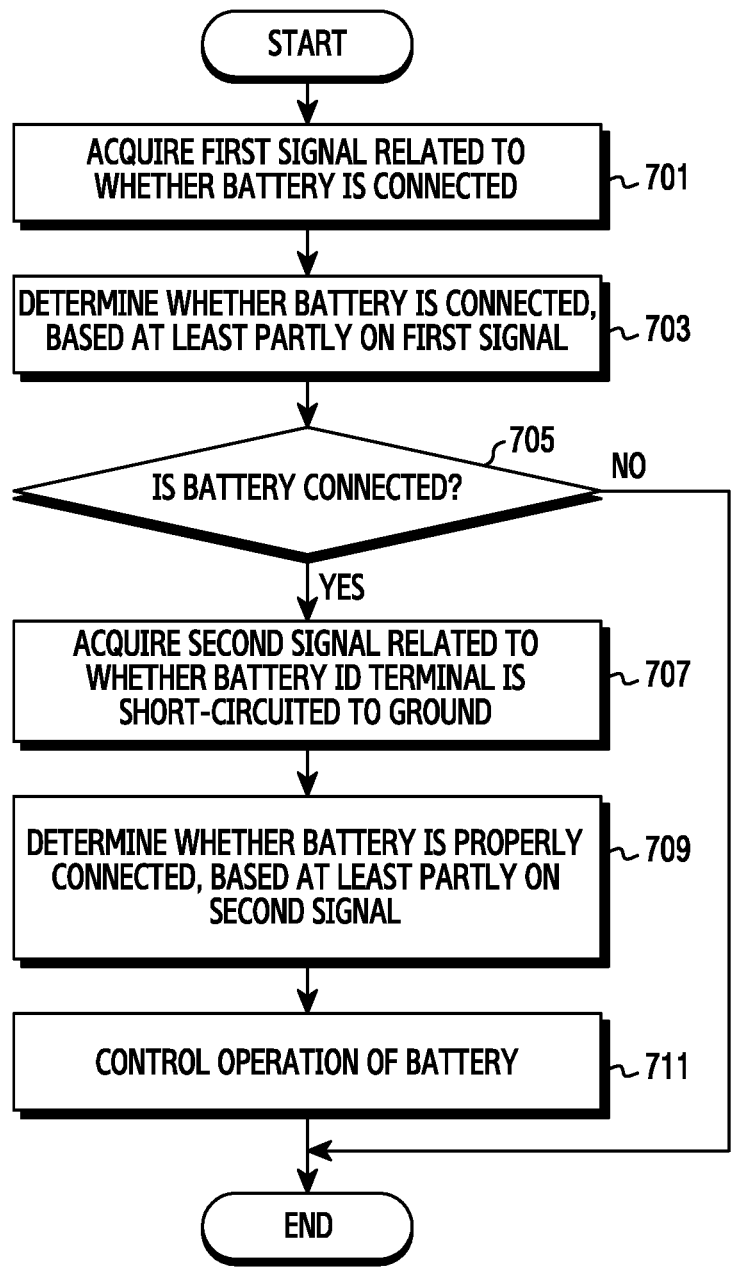
FIG. 7 is a flowchart for explaining a method for controlling an operation of a battery according to various embodiments.

FIG. 7 is a flowchart for explaining a method for controlling an operation of a battery according to various embodiments.

Referring to FIG. 7, in operation 701, the processor 340 (e.g., the processor 120 or 210) may acquire, from the battery detection circuit 330, a first signal related to whether the battery 320 (e.g., the battery 296) is connected. For example, the processor 340 may acquire a first signal which is generated by the battery detection circuit 330 and is related to whether the battery 320 is connected to the battery connector 310.

In operation 703, the processor 340 may determine whether the battery 320 is connected to the battery connector 310 (or whether the battery 320 is mounted to the electronic device 101), based at least partly on the first signal.

For example, when a first signal including information indicating that the battery 320 is not connected to the battery connector 310 is acquired from the battery detection circuit 330, the processor 340 may determine that the battery 320 is not connected to the battery connector 310 (or that the battery 320 is in a state of not being mounted to the electronic device 101). In another example, when a first signal including information indicating that the battery 320 is connected to the battery connector 310 is acquired from the battery detection circuit 330, the processor 340 may determine that the battery 320 is connected to the battery connector 310.

When the processor 340 has determined in operation 705 that the battery 320 is not connected to the battery connector 310, the processor 340 may terminate an operation of controlling the battery 320. For example, when the battery 320 is determined not to be connected to the battery connector 310, the processor 340 may terminate an operation related to charging of the battery 320. However, the present disclosure is not limited thereto. For example, when the battery 320 is determined not to be connected to the battery connector 310, the processor 340 may periodically monitor a first signal acquired from the battery detection circuit 330.

In various embodiments, when the battery 320 is not connected to the electronic device 101 and an external apparatus (e.g., a charging apparatus) is connected thereto or when an auxiliary battery is included in the electronic device 101, the processor 340 may be supplied with power from the external apparatus or the auxiliary battery. By using the supplied power, the processor 340 may acquire, from the battery detection circuit 330, a first signal including information indicating that the battery 320 is not connected to the battery connector 310 or is connected thereto.

In various embodiments, when an external apparatus is not connected to the electronic device 101 and the electronic device 101 does not include an auxiliary battery, if the battery 320 is connected to the battery connector 310, the processor 340 may acquire, from the battery detection circuit 330, a first signal including information indicating that the battery 320 is connected to the battery connector 310. When the battery 320 and the external apparatus are not connected to the battery connector 310 and the electronic device 101 does not include the auxiliary battery, the processor 340 does not acquire a first signal and a second signal described below, and may not operate.

When the processor 340 has determined in operation 705 that the battery 320 is connected to the battery connector 310, in operation 707, the processor 340 may acquire, from the short-circuit detection circuit 350, a second signal related to whether a battery ID terminal is short to the ground. For example, the processor 340 may acquire, from the short-circuit detection circuit 350, a second signal which is information on an output voltage of the comparator 353 included in the short-circuit detection circuit 350.

In an embodiment, the processor 340 may acquire a second signal through an interrupt pin thereof from the short-circuit detection circuit 350.

In operation 709, the processor 340 may determine whether the battery 320 is properly connected to the battery connector 310, based at least partly on the second signal.

For example, the processor 340 may determine whether the battery ID terminal is in the state of being short to the ground or whether the battery 320 is in the state of being connected to the battery connector 310, according to a voltage level, for example, a low or high level, that the second signal has.

In operation 711, the processor 340 may control an operation of the battery 320 based at least partly on a result of the determination of whether the battery ID terminal is in the state of being short to the ground or whether the battery 320 is in the state of being connected to the battery connector 310.

In an embodiment, when the battery ID terminal is determined to be in the state of being short to the ground, the processor 340 may limit (or cut off) power supply from the battery 320 to the system.

In another embodiment, when an external apparatus (e.g., a charging apparatus) is connected to the electronic device 101 and the processor 340 determines that the battery ID terminal is in the state of being short to the ground, the processor 340 may limit power supply from the charging apparatus to the battery 320.

In still another embodiment, when an OTG apparatus is connected to the electronic device 101 and the processor 340 determines that the battery ID terminal is in the state of being short to the ground, the processor 340 may limit power supplied to the OTG apparatus from the battery 320.

In an embodiment, when an external apparatus (e.g., a charging apparatus) is connected to the electronic device 101 and the processor 340 determines that the battery 320 is in the state of being connected to the battery connector 310, the processor 340 may perform an operation of charging the battery 320 by using power supplied from the external apparatus (e.g., a charging apparatus).

Figure 8:
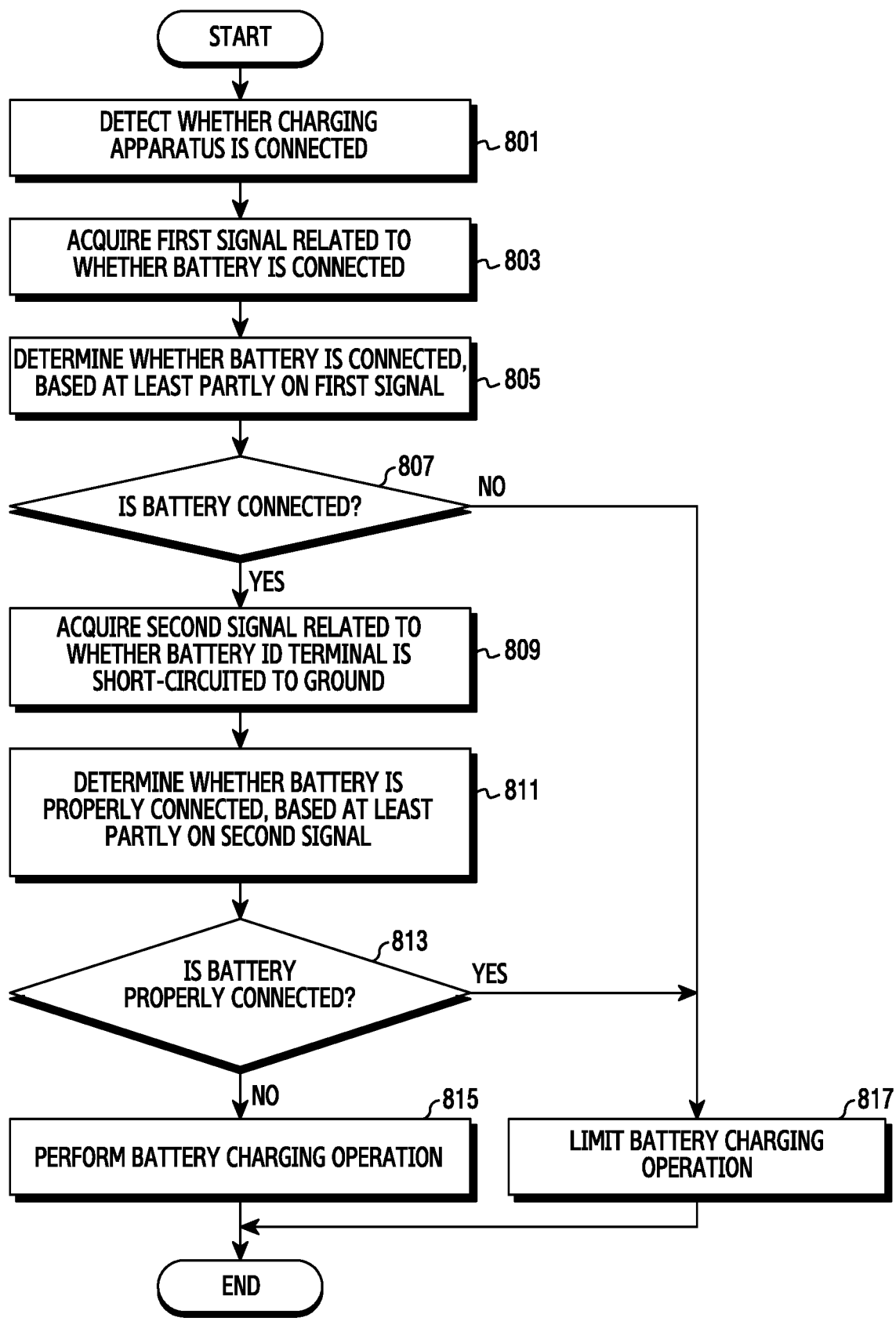
FIG. 8 is a flowchart for explaining a method for controlling, by an electronic device, an operation of charging a battery according to various embodiments.

FIG. 8 is a flowchart for explaining a method for controlling, by an electronic device, an operation of charging a battery according to various embodiments.

In various embodiments, FIG. 8 may be a flowchart for explaining a method for controlling, by the electronic device 101 (e.g., the processor 120 or 210), an operation of charging the battery 320 (e.g., the battery 296) when a charging apparatus is connected to the electronic device 101.

In operation 801, the processor 340 may detect whether a charging apparatus is connected. For example, when a charging apparatus is connected to the electronic device 101, the processor 340 may detect whether the charging apparatus is connected, based at least partly on information acquired from the charging apparatus through an interface (e.g., a Vbus terminal of the interface) or based at least partly on information on a voltage detected through the interface. However, a method for detecting a charging apparatus is not limited thereto. For example, when the charging apparatus supports the USB-type C standard, the processor 340 may detect whether the charging apparatus is connected to the electronic device 101, based at least partly on a Channel Configuration (CC) signal or a Sub-Band Use (SBU) signal acquired from the charging apparatus.

In operation 803, the processor 340 may acquire, from the battery detection circuit 330, a first signal related to whether the battery 320 is connected.

In operation 805, the processor 340 may determine whether the battery 320 is connected to the battery connector 310 (or whether the battery 320 is mounted to the electronic device 101), based at least partly on the first signal.

In various embodiments, operations 803 and 805 are identical or similar at least in part to operations 701 and 703 of FIG. 7, and thus, a detailed description thereof will be omitted.

When the processor 340 has determined in operation 807 that the battery 320 is not connected to the battery connector 310, in operation 817, the processor 340 may limit the operation of charging the battery 320. For example, the processor 340 may control a switching operation of the switch 370 or 371 illustrated in FIG. 5 or FIG. 6 to be able to limit (or cut off) power supplied to the battery 320 from the charging apparatus.

When the processor 340 has determined in operation 807 that the battery 320 is connected to the battery connector 310, in operation 809, the processor 340 may acquire, from the short-circuit detection circuit 350, a second signal related to whether a battery ID terminal is short to the ground.

In operation 811, the processor 340 may determine whether the battery 320 is properly connected to the battery connector 310, based at least partly on the second signal.

In various embodiments, operations 809 and 811 are identical or similar at least in part to operations 707 and 709 of FIG. 7, and thus, a detailed description thereof will be omitted.

When the processor 340 has determined in operation 813 that the battery 320 is properly connected, in operation 817, the processor 340 may limit the operation of charging the battery 320.

When the processor 340 has determined in operation 813 that the battery 320 is connected to the battery connector 310, in operation 815, the processor 340 may perform the operation of charging the battery 320. For example, the processor 340 may control a switching operation of the switch 370 or 371 illustrated in FIG. 5 or FIG. 6 to enable power to be supplied to the battery 320 from the charging apparatus.

Figure 9:
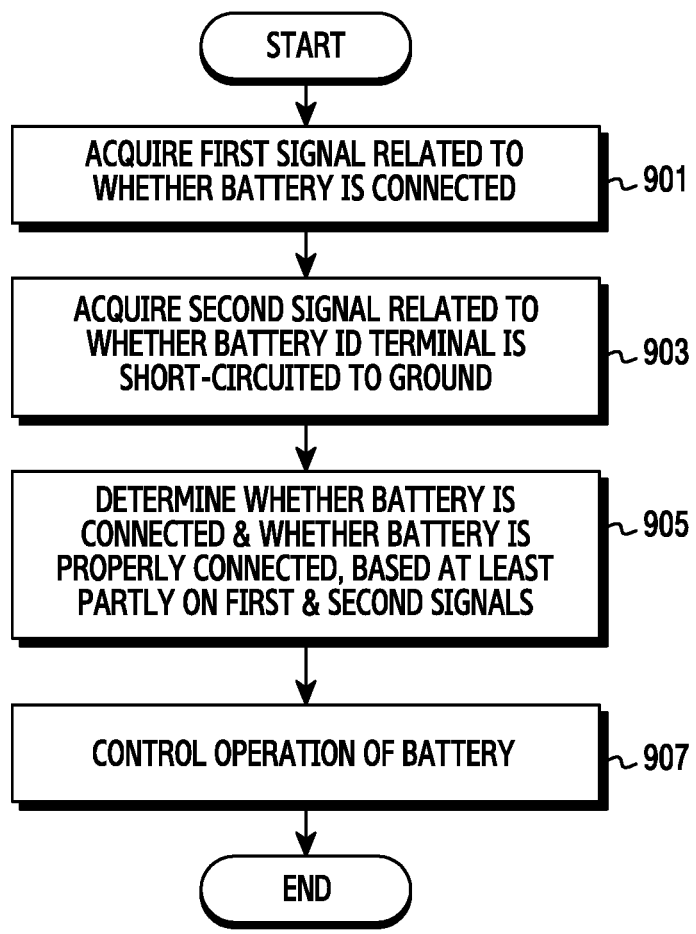
FIG. 9 is a flowchart for explaining a method for controlling an operation of a battery according to various embodiments.

FIG. 9 is a flowchart for explaining a method for controlling an operation of a battery according to various embodiments.

Referring to FIG. 9, in operation 901, the processor 340 (e.g., the processor 120 or 210) may acquire, from the battery detection circuit 330, a first signal related to whether the battery 320 (e.g., the battery 296) is connected. For example, the processor 340 may acquire a first signal which is generated by the battery detection circuit 330 and is related to whether the battery 320 is connected to the battery connector 310.

In various embodiments, when the battery 320 is not connected to the electronic device 101 and an external apparatus (e.g., a charging apparatus) is connected thereto or when an auxiliary battery is included in the electronic device 101, the processor 340 may be supplied with power from the external apparatus or the auxiliary battery. By using the supplied power, the processor 340 may acquire, from the battery detection circuit 330, a first signal including information indicating that the battery 320 is not connected to the battery connector 310 or is connected thereto.

In various embodiments, when an external apparatus is not connected to the electronic device 101 and the electronic device 101 does not include an auxiliary battery, if the battery 320 is connected to the battery connector 310, the processor 340 may acquire, from the battery detection circuit 330, a first signal including information indicating that the battery 320 is connected to the battery connector 310. When the battery 320 and the external apparatus are not connected to the battery connector 310 and the electronic device 101 does not include the auxiliary battery, the processor 340 does not acquire a first signal and a second signal and may not operate.

In operation 903, the processor 340 may acquire, from the short-circuit detection circuit 350, a second signal related to whether a battery ID terminal is short to the ground. For example, the processor 340 may acquire a second signal, which is information on an output voltage of the comparator 353 included in the short-circuit detection circuit 350, from the short-circuit detection circuit 350.

In an embodiment, the processor 340 may acquire a second signal through an interrupt pin thereof from the short-circuit detection circuit 350.

In operation 905, based at least partly on the first and second signals, the processor 340 may determine whether the battery 320 is properly connected to the battery connector 310 (or whether the battery 320 is mounted to the electronic device 101) and whether the battery 320 is properly connected.

For example, based at least partly on the first signal acquired from the battery detection circuit 330, the processor 340 may determine whether the battery 320 is connected to the battery connector 310, and simultaneously, may determine whether the battery 320 is properly connected to the battery connector 310, according to a voltage level of the second signal acquired from the short-circuit detection circuit 350.

In operation 907, the processor 340 may control the operation of the battery 320 based at least partly on a result of the determination of whether the battery 320 is in the state of not being connected to the battery connector 310, whether the battery 320 is in the state of being connected to the battery connector 310, or whether the battery ID terminal is in the state of being short to the ground.

In an embodiment, when the processor 340 determines that the battery 320 is in the state of not being connected to the battery connector 310, the processor 340 may terminate an operation related to charging of the battery 320.

In another embodiment, when the processor 340 determines that the battery 320 is improperly connected to the battery connector 310, the processor 340 may limit (or cut off) power supply from the battery 320 to the system.

In still another embodiment, when an external apparatus (e.g., a charging apparatus) is connected to the electronic device 101 and when the processor 340 determines that the battery 320 is improperly connected to the battery connector 310, the processor 340 may limit power supply from the charging apparatus to the battery 320.

In yet another embodiment, when an OTG apparatus is connected to the electronic device 101 and when the processor 340 determines that the battery 320 is improperly connected to the battery connector 310, the processor 340 may limit power supplied to the OTG apparatus from the battery 320.

In still yet another embodiment, when an external apparatus (e.g., a charging apparatus) is connected to the electronic device 101 and when the processor 340 determines that the battery 320 is in the state of being properly connected to the battery connector 310, the processor 340 may perform an operation of charging the battery 320 by using power supplied from the external apparatus (e.g., a charging apparatus).

Figure 10:
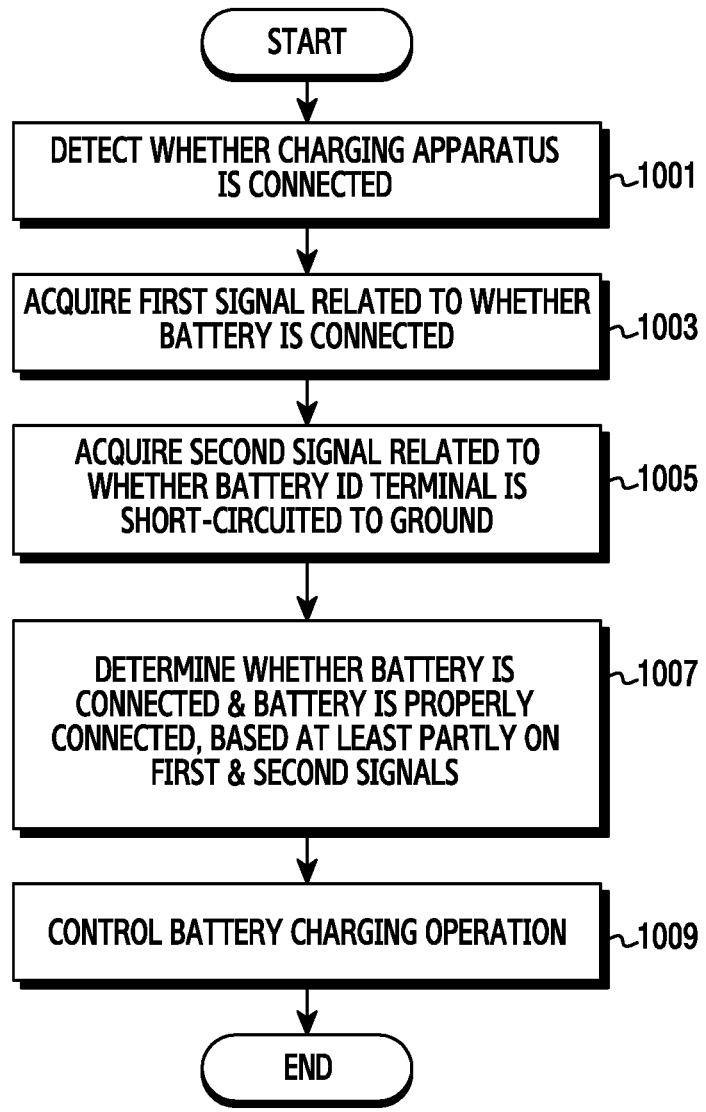
FIG. 10 is a flowchart for explaining a method for controlling, by an electronic device, an operation of charging a battery according to various embodiments.

FIG. 10 is a flowchart for explaining a method for controlling, by an electronic device, an operation of charging a battery according to various embodiments.

In various embodiments, FIG. 10 is a flowchart for explaining a method for controlling, by the electronic device 101, an operation of charging the battery 320 when a charging apparatus is connected to the electronic device 101.

In operation 1001, the processor 340 may detect whether a charging apparatus is connected. For example, when a charging apparatus is connected to the electronic device 101, the processor 340 may detect whether the charging apparatus is connected, based at least partly on information acquired from the charging apparatus through an interface (e.g., a Vbus terminal of the interface) or based at least partly on information on a voltage detected through the interface. However, a method for detecting a charging apparatus is not limited thereto.

In operation 1003, the processor 340 may acquire, from the battery detection circuit 330, a first signal related to whether the battery 320 is connected.

In operation 1005, the processor 340 may acquire, from the short-circuit detection circuit 350, a second signal related to whether a battery ID terminal is short to the ground.

In operation 1007, based at least partly on the first and second signals, the processor 340 may determine whether the battery 320 is connected to the battery connector 310 (or whether the battery 320 is mounted to the electronic device 101) and whether the battery 320 is properly connected to the battery connector 310.

In various embodiments, operations 1003 to 1007 of FIG. 10 are identical or similar at least in part to operations 901 to 905 of FIG. 9, and thus, a detailed description thereof will be omitted.

In operation 1009, the processor 340 may control the operation of charging the battery 320.

In an embodiment, when the battery 320 is determined not to be connected to the battery connector 310 or when the battery ID terminal is determined to be short to the ground, the processor 340 may limit power supplied to the battery 320 from the charging apparatus.

In another embodiment, when the processor 340 determines that the battery 320 is connected to the battery connector 310, the processor 340 may perform the operation of charging the battery 320. For example, the processor 340 may control a switching operation of the switch illustrated in FIG. 5 or FIG. 6 to enable power to be supplied to the battery 320 from the charging apparatus.

Figure 11:
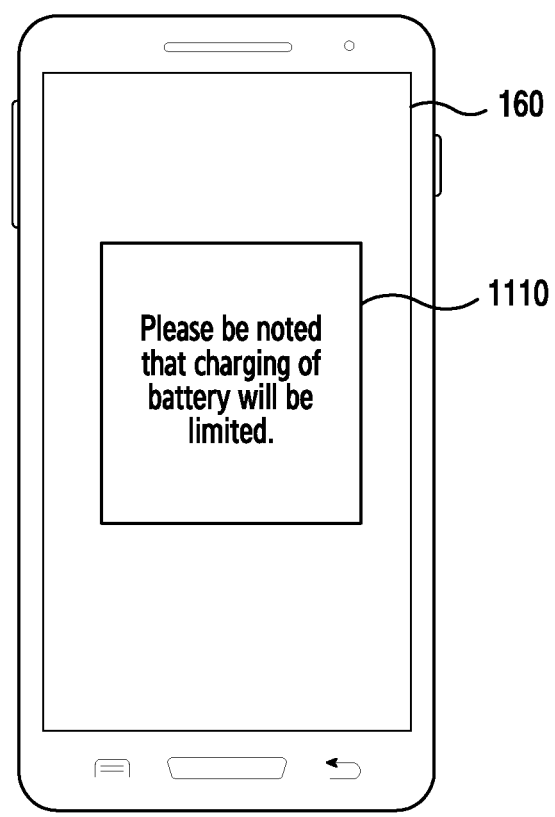
FIG. 11 is an illustrative view for explaining a method for controlling an operation of a battery according to various embodiments.

FIG. 11 is an illustrative view for explaining a method for controlling an operation of a battery according to various embodiments.

In an embodiment, when the processor 340 (e.g., the processor 120 or 210) determines that the battery 320 (e.g., the battery 296) is not connected to the battery connector 310 or that the battery 320 is improperly connected to the battery connector 310, the processor 340 may control the display 160 to display a notification message which represents restriction of charging of the battery 320. For example, when the processor 340 determines that the battery 320 is not connected to the battery connector 310 or that the battery 320 is improperly connected to the battery connector 310, the processor 340 may control the display 160 to display a notification message 1110 saying "Please be noted that charging of a battery 320 will be limited." However, the present disclosure is not limited thereto.

A method for controlling an operation of a battery 320 (e.g., the battery 296) by an electronic device 101 according to various embodiments may include: acquiring a first signal related to whether the battery 320 is connected to the battery connector 310, from a battery detection circuit 330 configured to detect whether the battery 320 is connected to the battery connector 310 including multiple terminals; making a determination of whether the battery 320 is connected to the battery connector 310, based at least partly on the first signal; acquiring a second signal indicating whether the battery ID terminal is short to the ground, from a short-circuit detection circuit 350 configured to detect whether a battery identification (ID) terminal among the multiple terminals is short to a ground, based at least partly on a level of a voltage measured at the battery ID terminal and a predetermined voltage level; based at least in part on the first and second signals, determining whether: the battery is not connected; the battery is properly connected; or the battery is improperly connected; and controlling an operation of the battery based at least partly on determining whether the battery is not connected, the battery is properly connected, or the battery is improperly connected.

In various embodiments, the making of the determination of whether the battery ID terminal is short to the ground may include, when the battery 320 is determined to be connected to the battery connector 310, determining whether the multiple terminals of the battery connector 310 are normally connected to multiple terminals of the battery 320 or whether the battery ID terminal is short to the ground, based at least partly on the second signal.

In various embodiments, the method may further include detecting that a charging apparatus is connected to the electronic device 101, and the controlling of the operation of the battery 320 may include limiting power supplied to the battery 320 from the charging apparatus when the battery is improperly connected.

In various embodiments, the battery detection circuit 330 may include: a voltage divider 331 including a pull-up resistor; and a voltage level detector 333 configured to detect the level of the voltage measured at the battery ID terminal.

In various embodiments: when the battery 320 is connected to the battery connector 310, the voltage divider 331 may be configured to divide a voltage supplied from a power source such that the voltage is applied, at a designated ratio, to a resistor included in the battery 320 and the pull-up resistor; and the voltage level detector 333 may be configured to detect, based at least partly on a level of a voltage applied to the pull-up resistor, whether the battery 320 is connected to the battery connector 310, may be configured to generate the first signal based at least partly on a result of the detection, and may be configured to deliver the first signal to the processor 340 (e.g., the processor 120 or 210).

In various embodiments, the pull-up resistor may be implemented to have a resistance which: when the multiple terminals of the battery connector 310 are properly connected to multiple terminals of the battery 320 and when the battery ID terminal is short to the ground, causes the voltage level detector 333 to recognize the voltage measured at the battery ID terminal as a high-level voltage; and when the battery 320 is not connected to the battery connector 310, causes the voltage level detector 333 to recognize the voltage measured at the battery ID terminal as a low-level voltage.

In various embodiments, the short-circuit detection circuit 350 may include: a reference voltage generator 351 configured to generate a reference voltage to be compared with the voltage measured at the battery ID terminal; and a comparator 353 configured to receive, as input, the voltage measured at the battery ID terminal and the reference voltage, generate the second signal based at least partly on a result of comparison of the voltage measured at the battery ID terminal with the reference voltage, and deliver the second signal to an interrupt pin of the processor 340.

In various embodiments, the reference voltage generator 351 may be configured to generate a reference voltage having a value between: a value of the voltage measured at the battery ID terminal when the multiple terminals of the battery connector 310 are normally connected to multiple terminals of the battery 320; and a value of the voltage measured at the battery ID terminal when the battery ID terminal is short to the ground.

Also, a data structure used in the above-described embodiments may be recorded on a computer-readable recording medium through various means. Examples of the computer-readable recording medium may include storage media, such as magnetic storage media (e.g., ROMs, floppy disks, and hard disks) and optically readable media (e.g., CD-ROMs and DVDs).

In an embodiment, a computer-readable recording medium may record a program for executing a method for controlling an operation of a battery 320 by an electronic device 101, the method including: acquiring a first signal related to whether the battery 320 is connected to a battery connector 310, from a battery detection circuit 330 configured to detect whether the battery 320 is connected to the battery connector 310 including multiple terminals; making a determination of whether the battery 320 is connected to the battery connector 310, based at least partly on the first signal; acquiring a second signal related to whether the battery ID terminal is short to the ground, from a short-circuit detection circuit 350 configured to detect whether a battery identification (ID) terminal among the multiple terminals is short to a ground, based at least partly on a level of a voltage measured at the battery ID terminal and a predetermined voltage level; determine based at least in part on the first and second signals, whether: the battery is not connected; the battery is properly connected; or the battery is improperly connected; and control an operation of the battery based at least partly on the determination. Hereinabove, the present disclosure has been described focusing on the exemplary embodiments. It will be understood by those having ordinary knowledge in the technical field to which the present disclosure pertains that the present disclosure may be implemented in modified forms without departing from essential features thereof. Therefore, the embodiments disclosed herein should be considered from an illustrative point of view rather than an limitative point of view. The scope of the present disclosure is not defined by the above description, but is defined by the appended claims, and all differences falling within the scope equivalent to the claims should be construed to be included in the present disclosure.

What is claimed is:

1. An electronic device comprising:
a battery connector comprising multiple terminals;
a battery detection circuit configured to detect whether a battery is connected to the battery connector;
a short-circuit detection circuit configured to detect whether a battery identification (ID) terminal among the multiple terminals is short to a ground, based at least partly on a level of a voltage measured at the battery ID terminal and a predetermined voltage level; and
a processor, wherein the processor is configured to:
acquire, from the battery detection circuit, a first signal related to whether the battery is connected to the battery connector;
determine whether the battery is connected to the battery connector, based at least partly on the first signal;
acquire, from the short-circuit detection circuit, a second signal related to whether the battery ID terminal is short-circuited to the ground;
based at least in part on the first and second signals, determining whether:
the battery is not connected;
the battery is properly connected; or
the battery is improperly connected; and
control an operation of the battery, based at least partly on determining whether the battery is not connected, the battery is properly connected, or the battery is improperly connected.

2. The electronic device of claim 1, wherein, in response to determining that the battery is connected to the battery connector, the processor is configured to determine, based at least partly on the second signal, whether the multiple terminals of the battery connector are properly connected to multiple terminals of the battery.

3. The electronic device of claim 1, wherein the processor is configured to:
detect that a charging apparatus is connected to the electronic device; and
limit power supplied to the battery from the charging apparatus in response to determining that the battery is improperly connected.

4. The electronic device of claim 1, wherein the battery detection circuit comprises:
a voltage divider comprising a pull-up resistor; and
a voltage level detector configured to detect the level of the voltage measured at the battery ID terminal.

5. The electronic device of claim 4, wherein:
when the battery is connected to the battery connector, the voltage divider is configured to divide a voltage supplied from a power source such that the voltage is applied, at a designated ratio, to a resistor included in the battery and the pull-up resistor; and
the voltage level detector is configured to:
detect, based at least partly on a level of a voltage applied to the pull-up resistor, whether the battery is connected to the battery connector,
generate the first signal based at least partly on a result of the detection, and
deliver the first signal to the processor.

6. The electronic device of claim 4, wherein the pull-up resistor is implemented to have a resistance which:

when the multiple terminals of the battery connector are properly connected to multiple terminals of the battery and when the battery ID terminal is short to the ground, causes the voltage level detector to recognize the voltage measured at the battery ID terminal as a high-level voltage; and
when the battery is not connected to the battery connector, causes the voltage level detector to recognize the voltage measured at the battery ID terminal as a low-level voltage.

7. The electronic device of claim 1, wherein the short-circuit detection circuit comprises:
a reference voltage generator configured to generate a reference voltage to be compared with the voltage measured at the battery ID terminal; and
a comparator configured to:
receive, as input, the voltage measured at the battery ID terminal and the reference voltage,
generate the second signal based at least partly on a result of comparison of the voltage measured at the battery ID terminal with the reference voltage, and
deliver the second signal to an interrupt pin of the processor.

8. The electronic device of claim 7, wherein the reference voltage generator is configured to generate a reference voltage having a value between:
a value of the voltage measured at the battery ID terminal when the multiple terminals of the battery connector are normally connected to multiple terminals of the battery; and
a value of the voltage measured at the battery ID terminal when the battery ID terminal is short to the ground.

9. A method for controlling an operation of a battery by an electronic device, the method comprising:
acquiring a first signal related to whether the battery is connected to a battery connector, from a battery detection circuit configured to detect whether the battery is connected to the battery connector comprising multiple terminals;
determining whether the battery is connected to the battery connector, based at least partly on the first signal;
acquiring a second signal indicating whether the battery ID terminal is short-circuited to the ground, from a short-circuit detection circuit configured to detect whether a battery identification (ID) terminal among the multiple terminals is short-circuited to a ground, based at least partly on a level of a voltage measured at the battery ID terminal and a predetermined voltage level;
based at least in part on the first and second signals, determining whether:
the battery is not connected;
the battery is properly connected; or
the battery is improperly connected; and
controlling an operation of the battery based at least partly on determining whether the battery is not connected, the battery is properly connected, or the battery is improperly connected.

10. The method of claim 9, wherein determining whether the battery ID terminal is short to the ground comprises, in response to determining that the battery is connected to the battery connector, determining whether the multiple terminals of the battery connector are normally connected to multiple terminals of the battery or the battery ID terminal is short to the ground, based at least partly on the second signal.

11. The method of claim 9, further comprising detecting that a charging apparatus is connected to the electronic device, and
wherein the controlling of the operation of the battery comprises limiting power supplied to the battery from the charging apparatus in response to determining that the battery is improperly connected.

12. The method of claim 9, wherein the battery detection circuit comprises:
a voltage divider comprising a pull-up resistor; and
a voltage level detector configured to detect the level of the voltage measured at the battery ID terminal.

13. The method of claim 12, wherein:
when the battery is connected to the battery connector, the voltage divider is configured to divide a voltage supplied from a power source such that the voltage is applied, at a designated ratio, to a resistor included in the battery and the pull-up resistor; and
the voltage level detector is configured to:
detect, based at least partly on a level of a voltage applied to the pull-up resistor, whether the battery is connected to the battery connector,
generate the first signal based at least partly on a result of the detection, and
deliver the first signal to a processor.

14. The method of claim 12, wherein the pull-up resistor is implemented to have a resistance which:
when the multiple terminals of the battery connector are properly connected to multiple terminals of the battery and when the battery ID terminal is short-circuited to the ground,
causes the voltage level detector to recognize the voltage measured at the battery ID terminal as a high-level voltage; and
when the battery is not connected to the battery connector, causes the voltage level detector to recognize the voltage measured at the battery ID terminal as a low-level voltage.

15. The method of claim 9, wherein the short-circuit detection circuit comprises:
a reference voltage generator configured to generate a reference voltage to be compared with the voltage measured at the battery ID terminal; and
a comparator configured to:
receive, as input, the voltage measured at the battery ID terminal and the reference voltage,
generate the second signal based at least partly on a result of comparison of the voltage measured at the battery ID terminal with the reference voltage, and
deliver the second signal to an interrupt pin of the processor.

16. The method of claim 15, wherein the reference voltage generator is configured to generate a reference voltage having a value between:

a value of the voltage measured at the battery ID terminal when the multiple terminals of the battery connector are normally connected to multiple terminals of the battery; and
a value of the voltage measured at the battery ID terminal when the battery ID terminal is short to the ground.

17. An electronic device comprising:
a battery connector comprising multiple terminals;
a battery detection circuit configured to detect whether a battery is connected to the battery connector;
a short-circuit detection circuit configured to detect whether a battery identification (ID) terminal among the multiple terminals is short-circuited to a ground, based at least partly on a level of a voltage measured at the battery ID terminal and a predetermined voltage level; and
a processor,
wherein the processor is configured to:
acquire, from the battery detection circuit, a first signal related to whether the battery is connected to the battery connector;
acquire, from the short-circuit detection circuit, a second signal related to whether the battery ID terminal is short to the ground;
determine based at least in part on the first and second signals, whether:
the battery is not connected;
the battery is properly connected; or
the battery is improperly connected; and
control an operation of the battery based at least partly on the determination.

18. The electronic device of claim 17, wherein the processor is configured to:
detect that a charging apparatus is connected to the electronic device; and
limit power supplied to the battery from the charging apparatus in response to determining that the battery is improperly connected.

19. The electronic device of claim 17, wherein the battery detection circuit comprises:
a voltage divider comprising a pull-up resistor; and
a voltage level detector configured to detect the level of the voltage measured at the battery ID terminal.

20. The electronic device of claim 17, wherein the short-circuit detection circuit comprises:
a reference voltage generator configured to generate a reference signal to be compared with the voltage measured at the battery ID terminal; and
a comparator configured to:
receive, as input, the voltage measured at the battery ID terminal and the reference signal,
generate the second signal based at least partly on a result of comparison of the voltage measured at the battery ID terminal with the reference signal, and
deliver the second signal to an interrupt pin of the processor.

* * * * *